United States Patent
Kunihiro et al.

(10) Patent No.: US 7,696,818 B2
(45) Date of Patent: Apr. 13, 2010

(54) AMPLIFYING APPARATUS

(75) Inventors: Kazuaki Kunihiro, Tokyo (JP);
Kiyohiko Takahashi, Tokyo (JP)

(73) Assignee: NEC Corporation, Tokyo (JP)

( * ) Notice: Subject to any disclaimer, the term of this patent is extended or adjusted under 35 U.S.C. 154(b) by 202 days.

(21) Appl. No.: 11/946,670

(22) Filed: Nov. 28, 2007

(65) Prior Publication Data

US 2008/0258831 A1 Oct. 23, 2008

Related U.S. Application Data

(63) Continuation-in-part of application No. PCT/JP2006/325037, filed on Dec. 15, 2006.

(30) Foreign Application Priority Data

Jan. 10, 2006 (JP) ............................. 2006-002459
Dec. 13, 2006 (JP) ............................. 2006-335657

(51) Int. Cl.
*H03F 3/38* (2006.01)
*H03G 3/20* (2006.01)

(52) U.S. Cl. ....................................... 330/10; 330/136
(58) Field of Classification Search .................. 330/10, 330/136
See application file for complete search history.

(56) References Cited

U.S. PATENT DOCUMENTS 5,929,776 A * 7/1999 Warble et al. .............. 340/7.32
2004/0046607 A1* 3/2004 Grange ....................... 330/10

FOREIGN PATENT DOCUMENTS

| JP | 10-256843 A | 9/1998 |
| JP | 11-346120 A | 12/1999 |
| JP | 2002-530917 A | 9/2002 |
| JP | 2002-359525 A | 12/2002 |
| JP | 2003-179444 A | 6/2003 |
| JP | 2005-295521 A | 10/2005 |
| JP | 2005-303954 A | 10/2005 |
| JP | 2006-295900 A | 10/2006 |
| WO | WO 91/00653 A1 | 1/1991 |
| WO | WO 01/08319 A1 | 2/2001 |

OTHER PUBLICATIONS

Kahn, Leonard R., "Single-Sideband Transmission by Envelope Elimination and Restoration", Proceedings of the I.R.E., 1952, pp. 803-806.
Staudinger, et al., "High Efficiency CDMA RF Power Amplifier Using Dynamic Envelope Tracking Technique", IEEE MTT-S Digest, 2000, pp. 873-876, WE3A-6, IEEE.

\* cited by examiner

*Primary Examiner*—Steven J Mottola
(74) *Attorney, Agent, or Firm*—Sughrue Mion, PLLC

(57) ABSTRACT

A pulse modulator generates a pulse-modulated signal by pulse-modulating and amplifying the amplitude component of an input signal. A low-pass filter filters the pulse-modulated signal from the pulse modulator, and generates an amplified amplitude signal which is obtained by amplifying the amplitude component. An error corrector generates a corrected amplitude signal by correcting an error of the amplified amplitude signal from the low-pass filter by using the amplitude component of the input signal. A mixing unit generates the output signal by mixing the corrected amplitude signal from the error corrector and the phase component of the input signal.

19 Claims, 17 Drawing Sheets

AMPLIFYING APPARATUS

This application is a continuation-in-part of PCT/JP2006/325037 filed on Dec. 15, 2006, which is based upon and claims the benefit of priority from Japanese Patent Applications No. 2006-002459 filed on Jan. 10, 2006. Additionally, this application is based upon and claims the benefit of priority from Japanese Patent Applications No. 2006-335657 filed on Dec. 13, 2006. The contents of the two Japanese Applications and the PCT application are incorporated herein by this reference.

BACKGROUND OF THE INVENTION

1. Field of the Invention

The present invention relates to an amplifying apparatus, specifically, to an amplifying apparatus amplifying a signal including an amplitude component and a phase component.

2. Description of the Related Art

In recent years, a digital modulating method such as QPSK (Quadrature Phase Shift Keying) and multiple-value QAM (Quadrature Amplitude Modulation) has been used for wireless communication. In the QPSK and the multiple-value QAM, an amplitude (envelope) of a high frequency input signal changes as time elapses. The ratio of a peak electric power to the average electric power of a signal whose amplitude changes is referred to as PAPR (Peak-to-Average Power Ratio).

When a signal whose PAPR is large is amplified, it is necessary to cause an amplifier to operate with back off in an area in which the electric power is lower than saturated electric power to secure enough linearity for peak electric power. The efficiency of a general linear amplifier is maximum around the saturated electric power, and if the general linear amplifier operates in an area in which the back off is large, the average efficiency becomes lower.

In a wireless LAN (Local Area Network), the Orthogonal Frequency Division Multiplexing (OFDM) method is adopted to realize a multiple carrier transfer. The PAPR of this modulating method becomes larger than that of the QPSK and the multiple-value QAM, so that the average efficiency of an amplifier becomes lower.

Thus, there is need for an amplifier which operates highly efficiently even in an area in which the back off is large.

To meet the need, Envelope Elimination and Restoration (EER) is proposed as a configuration in which a signal can be amplified highly efficiently in a wide dynamic range in the area in which the back off is large (refer to "PROCEEDINGS OF THE I. R. E." (L. Kahn), 1952, Vol. 40, pp. 803-806, FIG. 2).

FIG. 1 is a block diagram illustrating a configuration of an amplifier of the EER method. Referring to FIG. 1, an EER amplifier includes RF amplifier 901, pulse modulator 902, switching amplifier 903, low-pass filter 904, envelope detector 905, and limiter 906.

A digital-modulated high frequency analog signal which is inputted to the EER amplifier is caused to branch to two signals. One of the two signals is inputted to envelope detector 905, and the other signal is inputted to limiter 906.

Envelope detector 905 eliminates a carrier frequency component from the inputted signal to extract an amplitude component (envelope). An output of envelope detector 905 is inputted to pulse modulator 902. Pulse modulator 902 pulse-modulates the inputted signal to output the signal to switching amplifier 903. Switching amplifier 906 amplifies current of the signal from pulse modulator 902 by turning on/off VCC to output the signal to low-pass filter 904. Low-pass filter 904 filters the signal from switching amplifier 906. The output from low-pass filter 904 becomes an analog amplitude signal which is obtained by amplifying the amplitude signal outputted from envelope detector 905, and is delivered as an electric power source to RF amplifier 901.

On the other hand, limiter 906 to which the other branched signal is inputted converts the input signal to a phase signal, whose amplitude is constant, and which includes only phase information, and inputs the signal to RF amplifier 901.

RF amplifier 901 amplifies the phase signal from limiter 906 by using the amplified amplitude signal from low-pass filter 904 as an electric power source. Thereby, the amplitude signal from low-pass filter 904 and the phase signal from limiter 906 are mixed, and the mixed signal becomes a high frequency output signal which is obtained by amplifying the input signal to the EER amplifier.

According to the EER amplifier, RF amplifier 901 can be caused to constantly operate in the vicinity of the saturated electric power in which the efficiency is the maximum. Referring to a configuration of the amplitude signal side, it is sufficient that pulse modulator 902 processes a signal in a logic level, so that the electric power consumption of pulse modulator 902 is small. Switching amplifier 903 only turns on/off electric power source VCC as a switching operation, thus, amplifier 903 operates ideally with the efficiency of 100%. Low-pass filter 904 can be configured with lossless inductors and capacitances.

Therefore, as compared with a case in which RF amplifier 901 independently operates in a class-A operation or a class-B operation, the EER amplifier can highly efficiently amplify the digital-modulated high frequency input signal across a wide dynamic range.

In addition, Envelope Tracking (ET) is also known as another configuration which can highly efficiently amplify signals even in an area in which the back off is large (refer to e.g. "IEEE MTT-S Digest" 2000, Vol. 2, pp. 873-876, FIG. 1). A configuration of the ET amplifier is a configuration in which limiter 906 is eliminated from the EER amplifier illustrated in FIG. 1.

RF amplifier 901 does not operate as saturated, but operates linearly, so that the efficiency of the ET amplifier is slightly lower than that of the EER amplifier. However, as in the EER amplifier, the ET amplifier also changes an electric power source voltage of RF amplifier 901 according to the output electric power of the amplitude signal side including a pulse modulation and switching amplification, and delivers only required minimum DC electric power even in the back off area to RF amplifier 901. Thus, the ET amplifier can highly efficiently amplify signals as compared with a case in which RF amplifier 901 independently and linearly amplifies signals with a fixed electric power source.

While pulse width modulation (PWM), as a modulating method of a pulse modulator which are used in the EER amplifier and the ET amplifier, has been used as a general pulse modulating method, as another case, a configuration is proposed in which a delta modulation (or, pulse density modulation (PDM)) is applied, whose linearity is excellent (refer to Japanese Patent No. 3207153 (pp. 8, FIG. 3) U.S. Pat. No. 5,973,556 (pp. 3, FIG. 3).

FIG. 2 is a block diagram illustrating a configuration of another EER amplifier in which the delta modulation is applied. Referring to FIG. 2, another EER amplifier includes amplitude path 911 and phase path 920.

Amplitude path 911 includes delta modulation amplifier 910 and envelope detector 912. Delta modulation amplifier 910 includes envelope detector 913, difference detector 914, quantizer 915, class-D amplifier 916, low-pass filter 917, and attenuator 918.

Phase path 920 includes limiter 921, non-linear front amplifier 922, and output stage amplifier 923.

Delta modulation amplifier 910 of amplitude path 911 attenuates a high frequency output from output stage amplifier 923 of phase path 920 with attenuator 918, and extracts an amplitude component with envelope detector 913. Difference detector 914 obtains the difference between an amplitude component of a high frequency input detected by envelope detector 912 and an amplitude component of a high frequency output detected by envelope detector 913. Quantizer 915 quantizes the difference, and class-D amplifier 916 amplifies the quantized signal. An output of class-D amplifier 916 is filtered by low-pass filter 917, and is delivered as an electric power source to output stage amplifier 923 of phase path 920.

In phase path 920, limiter 921 extracts a phase component from the high frequency input, and non-linear front amplifier 922 amplifies a signal of the phase component. Output stage amplifier 923 finally amplifies an output of non-linear front amplifier 922, and generates a high frequency output.

As described above, the linearity of the EER amplifier can be improved by using a delta modulating method whose linearity is excellent.

However, there is a problem that a noise level of an amplifying apparatus using the EER method or the ET method is higher than that of a normal linear amplifying apparatus.

For example, this is because in pulse modulator 902 of the EER amplifier illustrated in FIG. 1, noise is induced when an analog signal is converted to a pulse signal. When pulse width modulation is used as a pulse modulating method, a switching noise is induced which corresponds to a cycle of a reference triangle waveform signal. When the delta modulation is used as the pulse modulating method, a white quantization noise is the main noise source.

The noise induced in pulse modulator 902 is reduced to some extent by low-pass filter 904. However, the noise is not completely eliminated, and the amplitude signal which is superimposed with remaining noise is mixed with a phase signal in RF amplifier 901.

As a result, a noise component is mixed in an output signal, and SNR (Signal to noise ratio) of a spectrum of the output signal is degraded. In wireless communications in recent years, such as mobile telephones, using digital modulation, it is specified in a communication standard that an adjacent channel leakage power ratio (ACPR) will be suppressed to a low level. If the SNR is degraded by noise induced in pulse modulator 902, the specification for the ACPR may not be satisfied.

To improve the SNR of pulse modulator 902, in the pulse width modulating method, it is effective to increase the frequency (switching frequency) of the reference triangle waveform signal which is used for comparison with an input signal. In the delta modulating method, it is effective to increase a sampling frequency, and increase an over-sampling ratio. The over-sampling ratio is a ratio of a sampling frequency to a frequency which is twice the input signal band.

However, if these techniques are adopted, problems will occur in which electric power consumption of a signal processing circuit in pulse modulator 902 is increased, loss induced when switching amplifier 903 is switched is increased, and electric power consumption of the entire EER amplifier is increased.

As described above, there exists a trade off between the increase of the SNR and the decrease of electric power consumption in the pulse modulating method.

On the other hand, it is assumed that the EER amplifier illustrated in FIG. 2 can correct an error attributed to the non-linearity of delta modulation amplifier 910 and output stage amplifier 923 by providing feedback from output stage amplifier 923 to delta modulator 910. However, a negative feedback loop is configured to be returned to delta modulator 910, so that quantization error which is induced by quantizer 915 in delta modulator 910 is superimposed again. Thus, it is thought that waveform distortion arise from non-linearity can be reduced but noise can not be eliminated in principle with this configuration.

SUMMARY OF THE INVENTION

It is an object of the present invention to provide a highly effective and high quality high frequency amplifying apparatus.

To achieve the above object, an amplifying apparatus of the present invention is an amplifying apparatus generating an output signal which is an input signal amplified by amplifying an amplitude component of an input signal including the amplitude component and a phase component and mixing the amplitude component with a phase component, and includes a first pulse modulator, a low-pass filter, an error corrector, and a mixing unit.

The first pulse modulator generates a pulse-modulated signal by pulse-modulating and amplifying an amplitude component of an input signal. The low-pass filter filters the pulse-modulated signal from the first pulse modulator, and generates an amplified amplitude signal which is obtained by amplifying an amplitude component. The error corrector generates a corrected amplitude signal by correcting an error included in the amplified amplitude signal from the low-pass filter by using the amplitude component of the input signal. The mixing unit generates the output signal by mixing the corrected amplitude signal from the error corrector and the phase component of the input signal.

According to the present invention, the amplitude component is amplified by the first pulse modulator and the low-pass filter, and an error attributed to quantization noise induced in the first pulse modulator is corrected by the error corrector which is configured separately from the first pulse modulator, so that without increasing the frequency of the first pulse modulator, the error can be highly efficiently reduced, and an output signal of high quality can be generated.

The above and other objects, features, and advantages of the present invention will become apparent from the following description with references to the accompanying drawings which illustrate examples of the present invention.

DETAILED DESCRIPTION OF THE PREFERRED EMBODIMENTS

Figure 1:
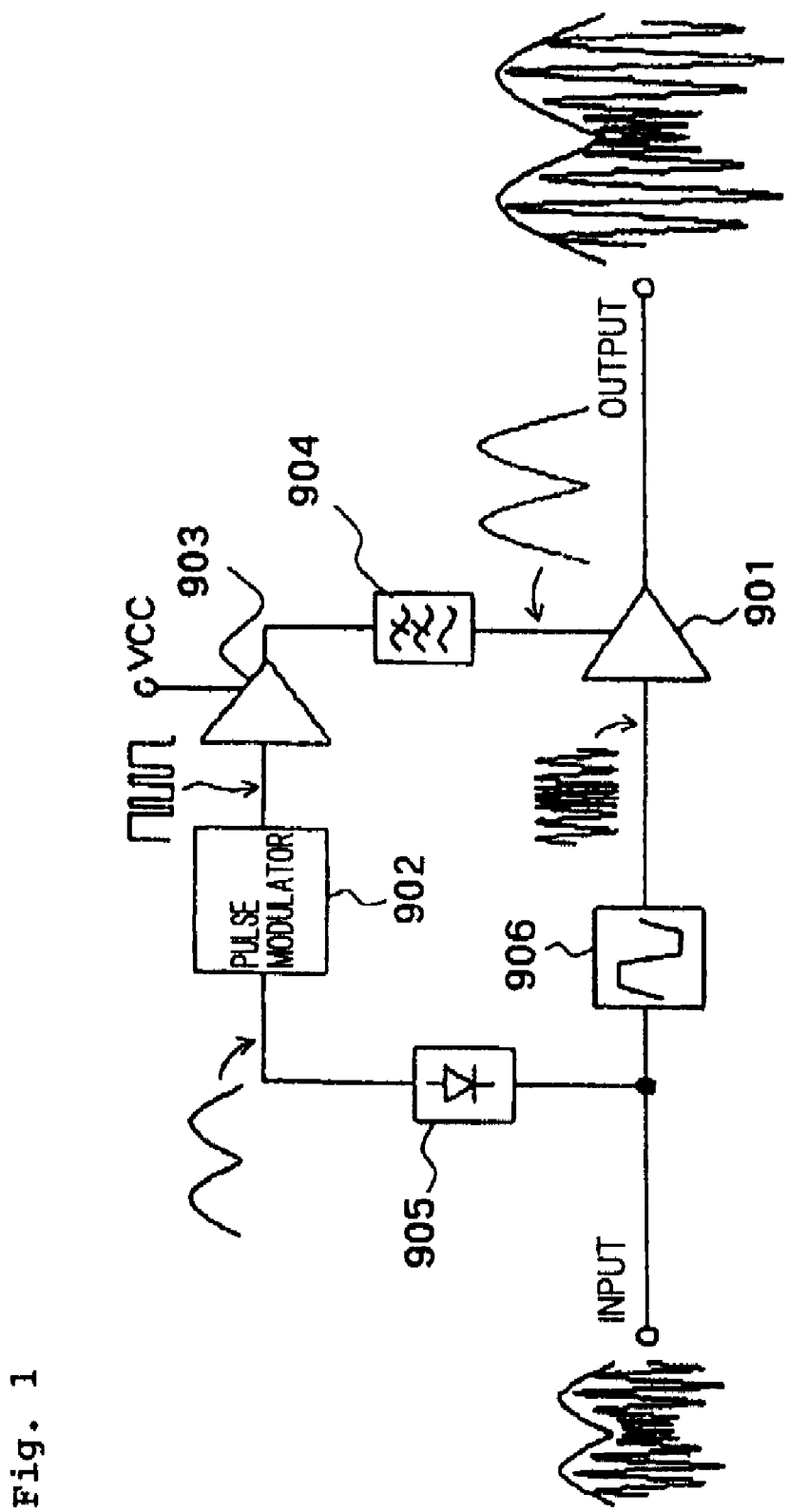
FIG. 1 is a block diagram illustrating a configuration of an amplifier according to EER method.
Figure 2:
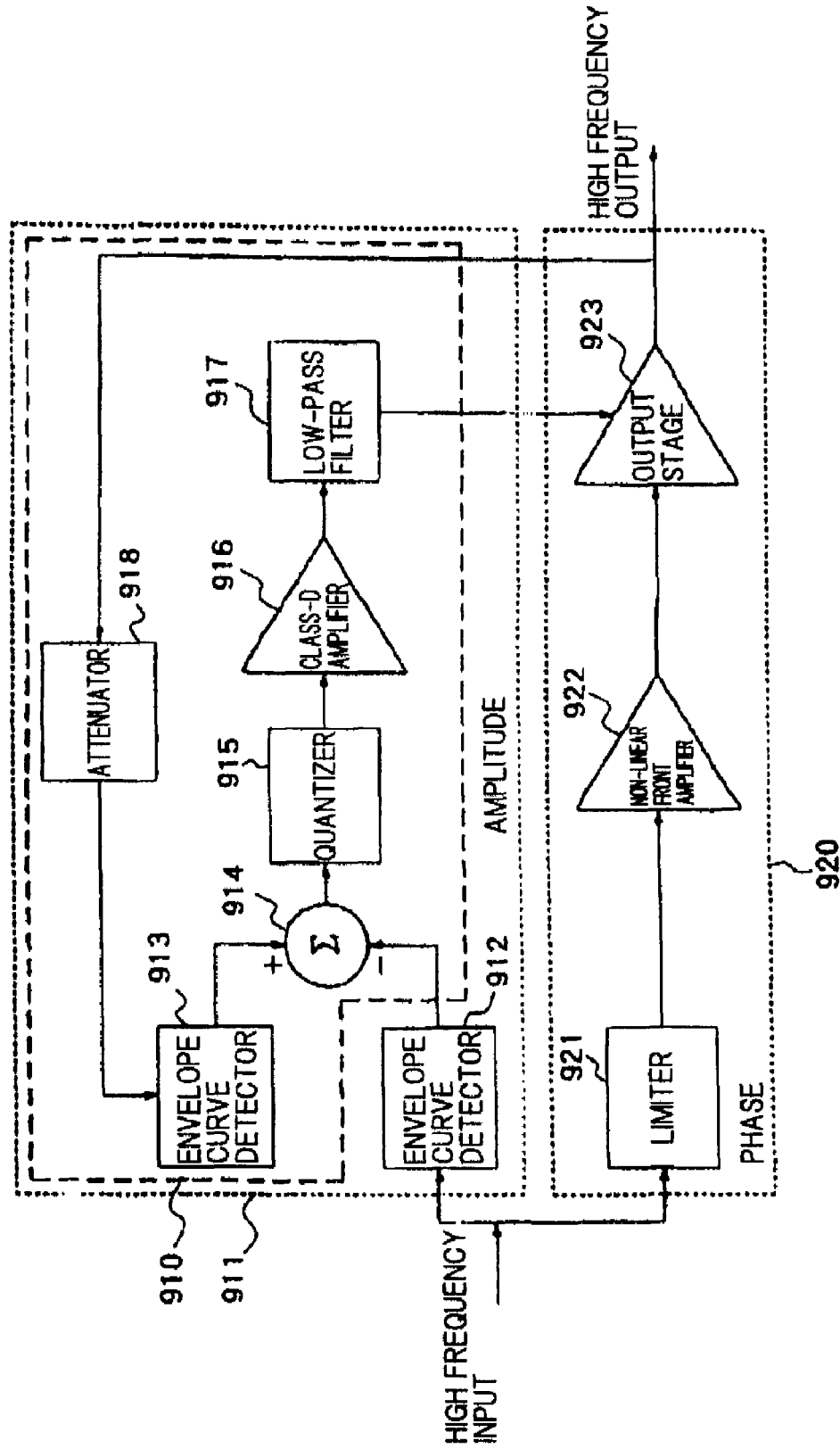
FIG. 2 is a block diagram illustrating a configuration of an EER amplifier to which a delta modulation is applied.

Exemplary embodiments will be described in detail referring to the drawings.

First Exemplary Embodiment

Figure 3:
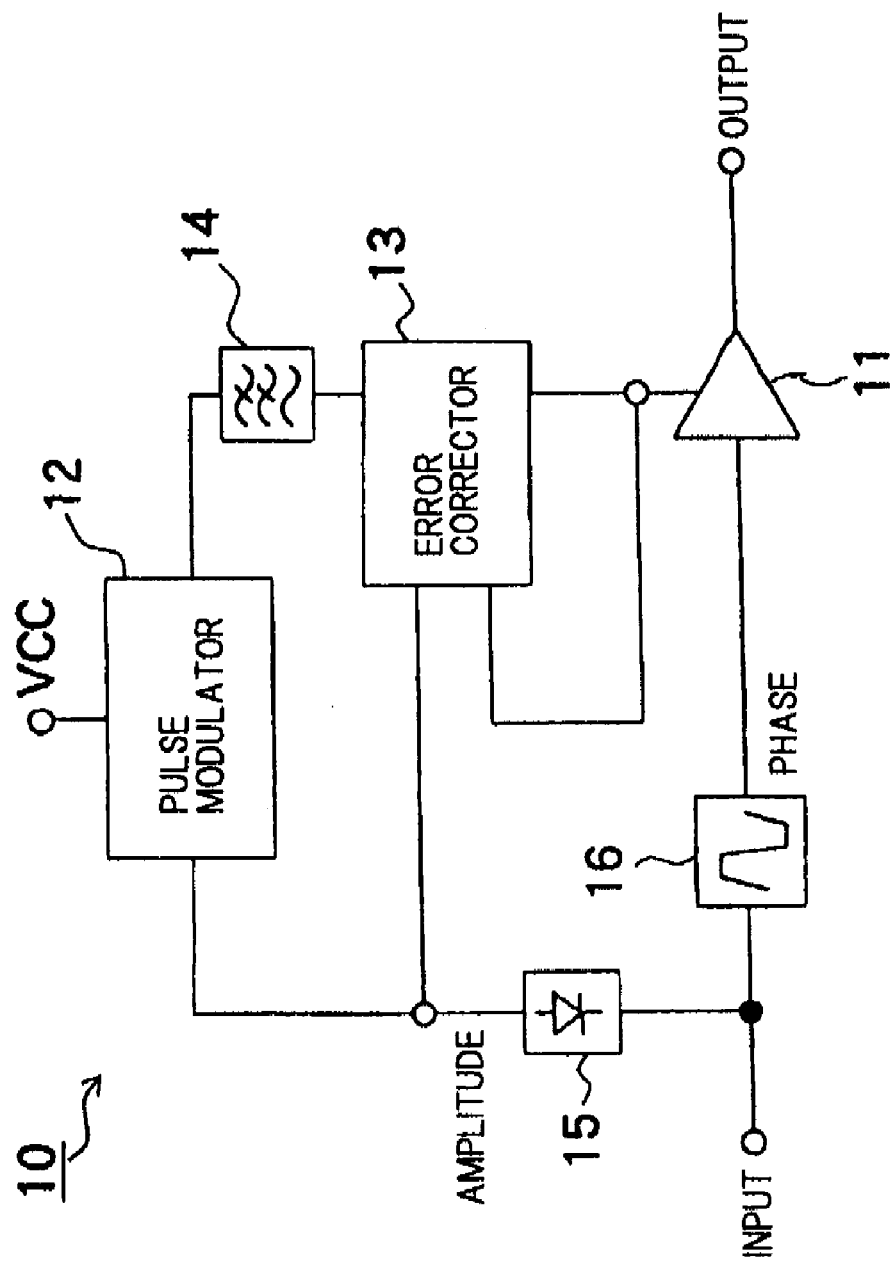
FIG. 3 is a block diagram illustrating a configuration of a high frequency amplifying apparatus according to a first exemplary embodiment.

FIG. 3 is a block diagram illustrating a configuration of a high frequency amplifying apparatus according to a first exemplary embodiment. Referring to FIG. 3, high frequency amplifying apparatus 10 is an EER amplifier including RF amplifier 11, first pulse modulator 12, error corrector 13, low-pass filter 14, envelope detector 15, and limiter 16.

A digital-modulated high frequency input analog signal which is inputted to high frequency amplifying apparatus 10 is caused to branch to two signals. One signal of the two signals is inputted to envelope detector 15, and the other signal is inputted to limiter 16.

Envelope detector 15 eliminates a carrier frequency component from the inputted signal, and extracts an amplitude component (envelope). An output of envelope detector 5 is inputted to pulse modulator 2 and error corrector 13.

First pulse modulator 12 pulse-modulates and amplifies a signal from envelope detector 15 to output the signal to low-pass filter 14. Here, it is assumed that first pulse modulator 12 is a delta modulator, as an example.

Low-pass filter 14 filters the signal from first pulse modulator 12, and thereby, generates an analog amplitude signal which is obtained by amplifying the amplitude signal from envelope detector 15 to provide the signal to error corrector 13. Low-pass filter 14 is configured with, for example, a second-order LC low-pass filter.

Error corrector 13 compares the amplitude signal from envelope detector 15 with an amplitude signal generated by itself, and corrects the error of the amplitude signal generated by itself based on the result of the comparison. The amplitude signal outputted by error corrector 13 is delivered as an electric power source to RF amplifier 11.

On the other hand, limiter 16 converts the other signal, which is caused to branch from the digital-modulated high frequency input analog signal which is inputted to high frequency amplifying apparatus 10, to a phase signal, whose amplitude is constant, which includes only phase information, and inputs the signal to RF amplifier 11.

RF amplifier 11 amplifies the phase signal from limiter 16 by using the amplitude signal from error corrector 13 as an electric power source. Thereby, the output of the RF amplifier becomes a signal which is obtained by mixing the amplitude signal from error corrector 13 and the phase signal from limiter 16.

Figure 4:
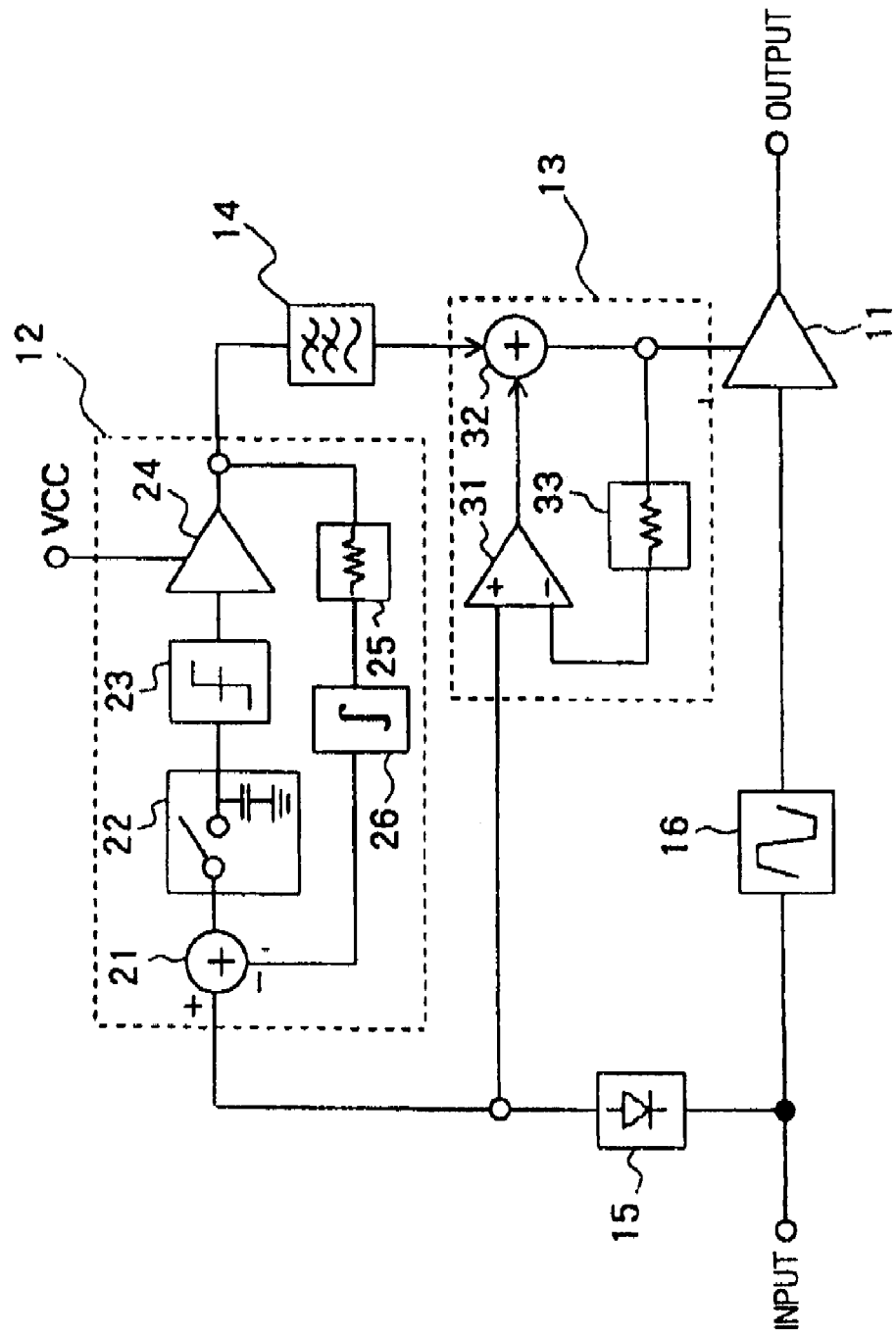
FIG. 4 is a block diagram illustrating a detailed configuration of the high frequency amplifying apparatus according to the first exemplary embodiment.

FIG. 4 is a block diagram illustrating a detailed configuration of the high frequency amplifying apparatus according to the first exemplary embodiment. Referring to FIG. 4, first pulse modulator 12 illustrated in FIG. 3 includes subtractor 21, sample hold circuit 22, comparator (quantizer) 23, switching amplifier 24, attenuator 25, and integrator 26.

The amplitude component of the high frequency input signal detected by envelope detector 15 is inputted to first pulse modulator 12.

Subtractor 21 obtains the difference between the amplitude component from envelope detector 15 and a reference signal to provide the difference to sample hold circuit 22.

Sample hold circuit 22 samples a signal from subtractor 21.

Comparator 23 decides a magnitude relation between an input signal and a reference signal by comparing a value of the sampled input signal with a threshold, and inputs the decision result to switching amplifier 24. As an example, comparator 23 outputs "+1" when an input signal is larger than a reference signal, and outputs "0" when the input signal is smaller than the reference signal.

Switching amplifier 24 turns on/off an electric power source voltage VCC depending on the result of the decision from comparator 23, and thereby, amplifies current specified by the result. The current amplifying is executed by switching the electric power source voltage while maintaining the relation between on and off of the pulse modulation. An operation of switching amplifier 24 is only an on and off operation, so that switching amplifier 24 can maintain a highly efficient operation regardless of the PAPR of an original input signal. If a switching operation is ideal, the efficiency becomes 100%. A part of an output of switching amplifier 24 is provided to low-pass filter 14, and another part is provided to attenuator 25.

Attenuator 25 attenuates the output of switching amplifier 24 to an appropriate level, and provides the signal to integrator 26.

Integrator 26 integrates the signal from attenuator 25 to generate a reference signal, and provides the signal to subtractor 21. Integrator 26 is configured with, for example, a primary RC low-pass filter.

According to the operations of each section of first pulse modulator 12, which are described above, if an input signal tends to increase, a ratio of "+1" increases in an output of comparator 23, and if the input signal tends to decrease, a ratio of "0" increases, so that first pulse modulator 12 operates as a delta modulator in which a pulse density changes depending on increase and decrease of the input signal. When a delta-modulated signal from first pulse modulator 12 is inputted to low-pass filter 14, a signal is regenerated, which is obtained by amplifying the original analog amplitude signal. In the signal regenerated at this time, a quantization noise is left without being completely eliminated, which is induced due to the decision by comparator 23.

Error corrector 13 eliminates the quantization noise. Error corrector 13 includes error amplifier 31, adder 32, and attenuator 33.

A signal passing through low-pass filter 14 is provided to adder 32. Adder 32 adds the signal from low-pass filter 14 and a correction signal from error amplifier 31. Adder 32 is configured with a coupling capacitance as an example.

An output of adder 32 is caused to branch, one signal is delivered as an electric power source to RF amplifier 11, and also, the other signal is attenuated by attenuator 33 to be provided to error amplifier 31.

Error amplifier 31 compares the signal from envelope detector 15 with the signal from attenuator 33 to obtain a difference, and provides the difference as a correction signal to adder 32.

According to the operations of each section of error corrector 13, which are described above, the difference is negatively fed back to a signal path, so that if a gain of error amplifier 31 is sufficiently high, a remaining error component due to the quantization noise is corrected, and the waveform of an output from RF amplifier 11 becomes close to the waveform of the input signal to high frequency amplifying apparatus 10.

A linear amplifier is used as error amplifier 31 of error corrector 13. An electric power consumption of a linear amplifier is not normally small. However, in the present invention, a waveform is regenerated by once switching-amplifying in first pulse modulator 12, so that the amount of correction by error corrector 13 is a small value induced by the quantization noise.

Figure 14:
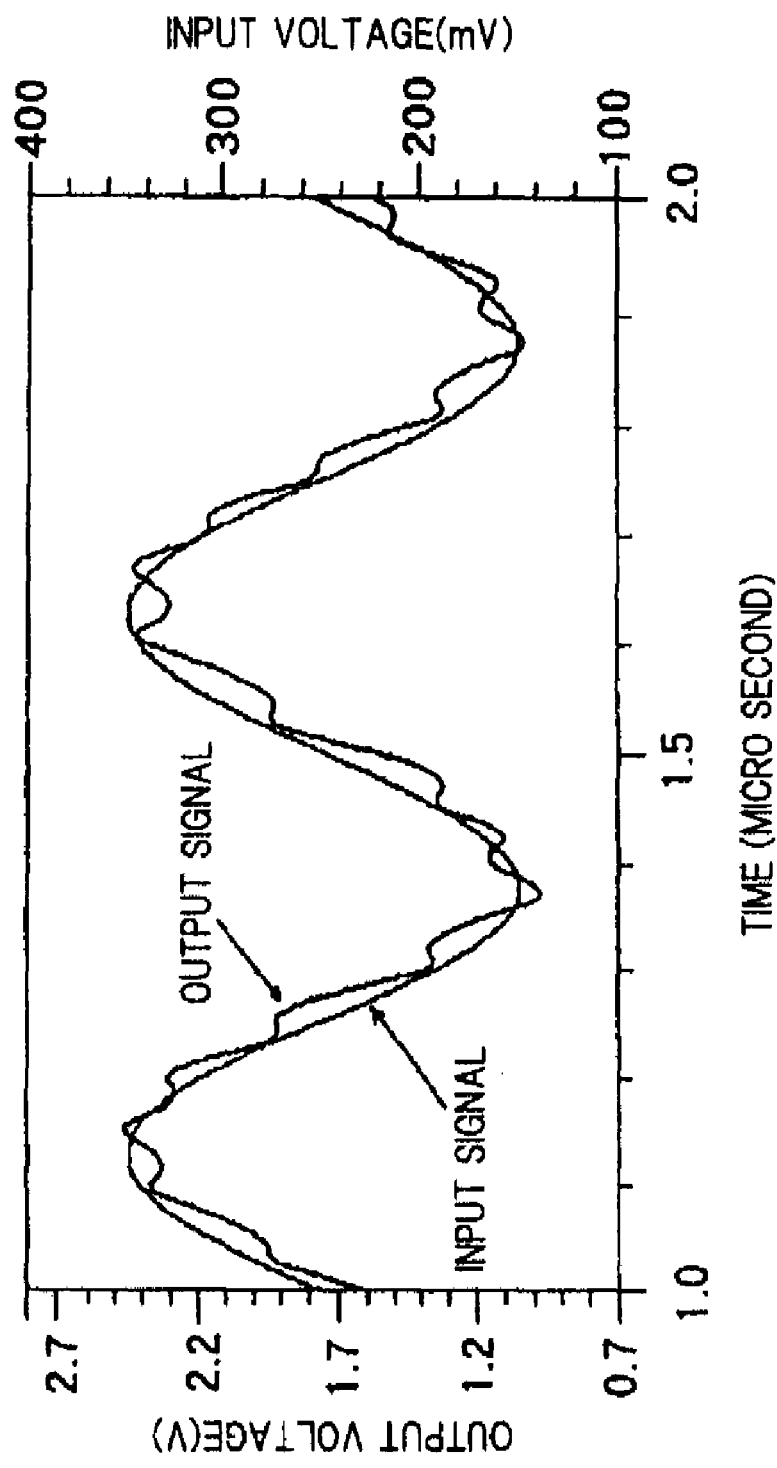
FIG. 14 is a graph illustrating an input signal and an output signal of a delta modulator.

FIG. 14 illustrates an input signal and an output signal of the delta modulator. The difference between the input signal and the output signal will be corrected by error corrector 13, and it can be also understood from FIG. 14 that the difference is small. Therefore, electric power consumed in error corrector 13 is small.

On the other hand, for example, it is necessary to increase a sampling frequency of sample hold circuit 22 to improve the SNR in first pulse modulator (delta modulator) 12. If the sampling frequency is doubled, the SNR is improved by approximately 9 dB. However, electric power consumption that is induced when switching amplifier 24 switches is increased in proportion to the frequency, so that if the sampling frequency is increased, the electric power consumption of first pulse modulator 12 is increased.

As described above, in the present exemplary embodiment, in high frequency amplifying apparatus 10 of the EER method which extracts the amplitude component and the phase component from the high frequency input signal including an amplitude variation, and amplifies the amplitude component by using first pulse modulator 12 to mix the amplitude component with the phase component, an error attributed to the quantization noise induced in first pulse modulator 12 is corrected by error corrector 13 which is configured separately from first pulse modulator 12, and whose electric power consumption is small. The EER amplifier can execute an amplifying operation which is, originally, highly efficient in principle. According to the present exemplary embodiment, an error can be reduced without increasing the sampling frequency in first pulse modulator 12, so that a high frequency signal can be amplified highly efficiently (low electric power consumption) and in high quality (low SNR).

In error corrector 13, since an error is corrected by using a linear amplifier, electric power is consumed in the linear amplifier, however, only a small error is corrected, which is induced in first pulse modulator 12, so that small electric power consumption is sufficient.

Meanwhile, here, as illustrated in FIG. 4, while an example is described where the delta modulator is used for first pulse modulator 12, the present invention is not limited to this configuration. As another configuration example, a sigma delta modulator whose degree is arbitrary may be used for first pulse modulator 12. By using the sigma delta modulator, the distribution of noises can be moved to a high frequency side, and a higher SN ratio can be obtained in the vicinity of a signal band.

A configuration of error corrector 13 illustrated in FIG. 4 is one example, the present invention is not limited to this configuration.

Figure 5:
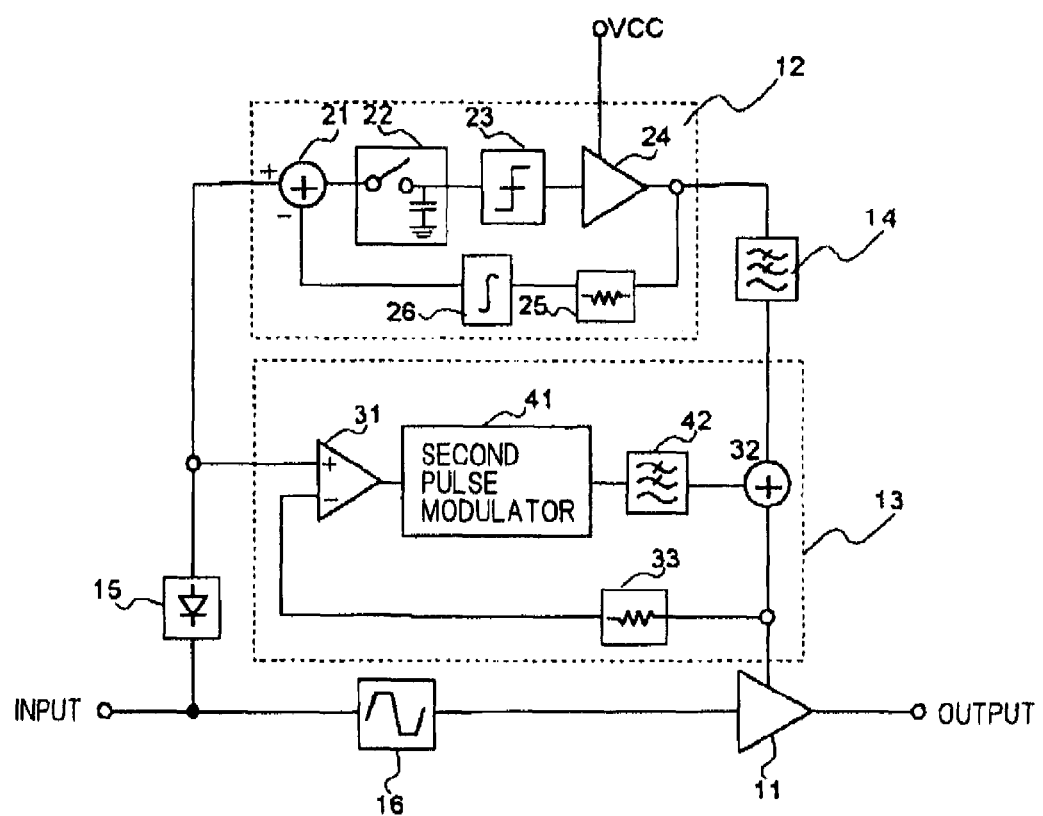
FIG. 5 is a block diagram illustrating another configuration example of an error corrector in the first exemplary embodiment.

FIG. 5 is a block diagram illustrating another configuration example of an error corrector in the first exemplary embodiment. Referring to FIG. 5, the configuration of first pulse modulator 12 is the same as that illustrated in FIG. 4. On the other hand, error corrector 13 is different from that illustrated in FIG. 4, and includes linear amplifier 31, adder 32, attenuator 33, second pulse modulator 41, and low-pass filter 42.

In the example of FIG. 5, as in FIG. 4, an error component of an amplitude signal from low-pass filter 14 is also detected by linear amplifier 31 by comparing it with an input signal. However, in the example of FIG. 4, by adjusting the amount of feed back by attenuator 33, the gain of linear amplifier 31 is caused to be the same as the gain of first pulse modulator 12, the error component is amplified up to a desired level only by linear amplifier 31, and a correction signal is directly inputted to adder 32. However, in the example of FIG. 5, the amount of feed back by attenuator 33 is increased, and the amplifying ratio of linear amplifier 31 is intentionally decreased. The output of linear amplifier 31 is inputted to second pulse modulator 41. In such a case, second pulse modulator 41 samples only the error component, so that second pulse modulator 41 samples the original signal with substantially higher resolution than first pulse modulator 12.

After the error component is pulse amplified in second pulse modulator 41 up to a desired level, the error component is regenerated by low-pass filter 42 and inputted to adder 32.

In such a configuration, for an input signal, even when the sampling accuracy of first pulse modulator 12 is low, and the error included in an output of low-pass filter 14 is large, the error component can be corrected using a smaller electric power consumption than a case in which only linear amplifier 31 is used.

The configuration of second pulse modulator 41 may be the same as that of first pulse modulator 12, and specifically, may be a delta modulator, a sigma delta modulator whose degree is arbitrary, or a pulse width modulator.

When the sampling accuracy of first pulse modulator 12 is low or the like, an ancherious filter (low-pass filter) may be provided in the input of first pulse modulator 12.

Figure 6:
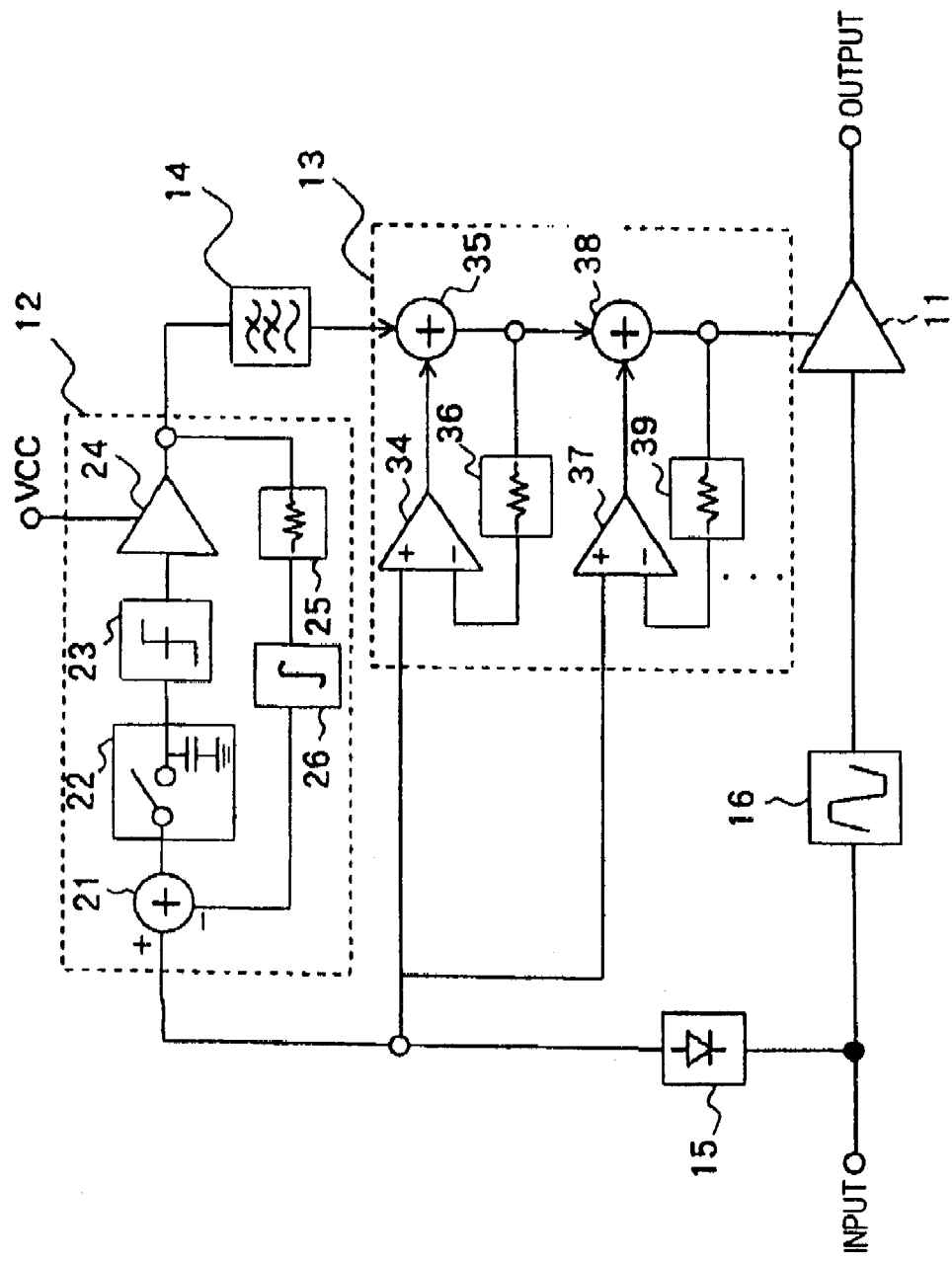
FIG. 6 is a block diagram illustrating another configuration example of an error corrector in the first exemplary embodiment.

FIG. 6 is a block diagram illustrating another configuration example of an error corrector in the first exemplary embodiment. Referring to FIG. 6, a configuration of first pulse modulator 12 is the same as that illustrated in FIG. 4. On the other hand, error corrector 13 is different from that illustrated in FIG. 4, and includes a plurality of feedback loops (two in FIG. 6).

According to FIG. 6, error corrector 13 includes error amplifiers 34 and 37, adders 35 and 38, and attenuators 36 and 39. A first feedback loop is configured with error amplifier 34, adder 35, and attenuator 36, and a second feedback loop is configured with error amplifier 37, adder 38, and attenuator 39. The operation of each feedback loop is the same as that of the feedback loop which is configured with error amplifier 31, adder 32, and attenuator 33, which is illustrated in FIG. 4.

In an example of FIG. 6, an error of the amplitude signal from low-pass filter 14 is corrected by the first feedback loop, and is further corrected by the second feedback loop. Thereby, even if each gain of error amplifiers 34 and 37 is not sufficient to correct the remaining error, the remaining error component can be corrected.

Figure 7:
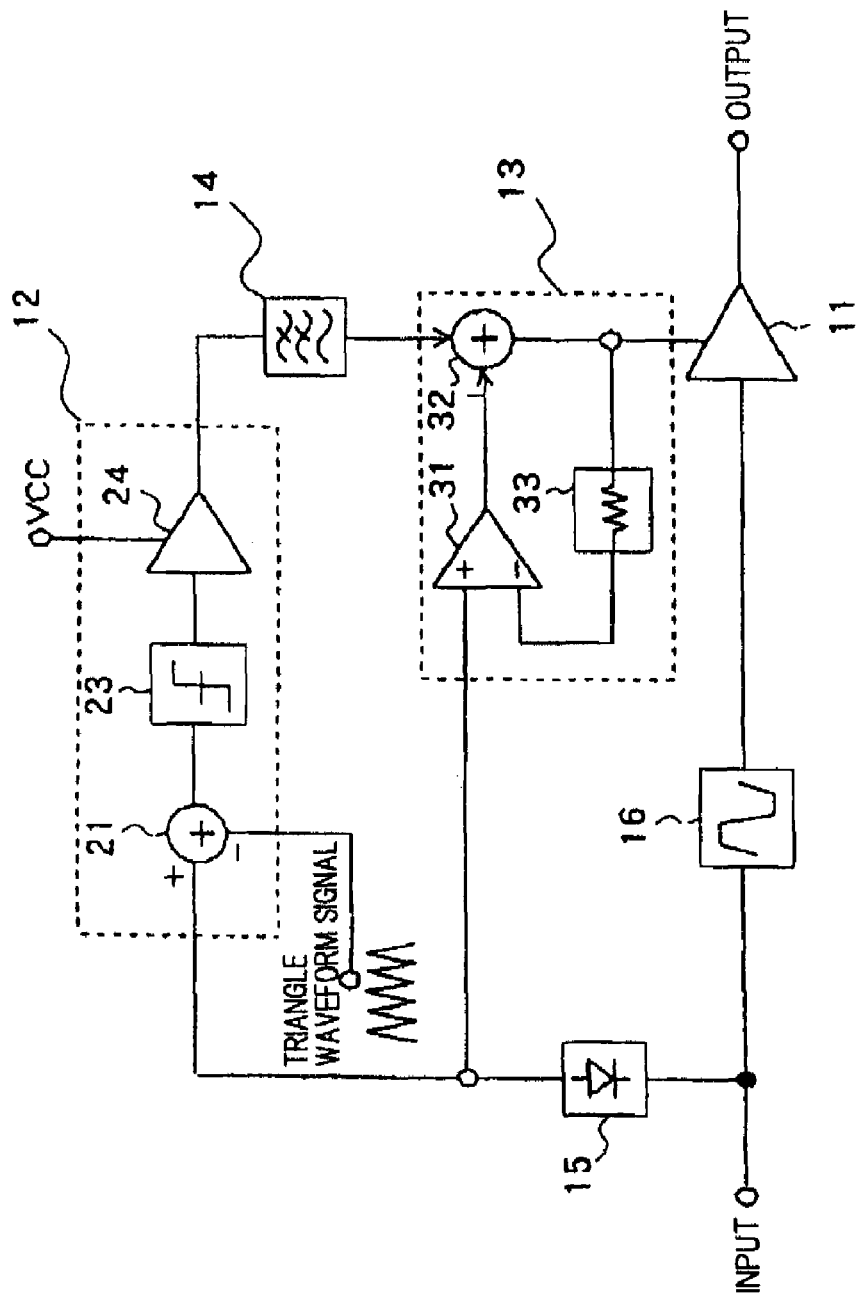
FIG. 7 is a block diagram illustrating another configuration example of a first pulse modulator in the first exemplary embodiment.

While the delta modulator is used for first pulse modulator 12 in FIGS. 4, 5 and 6, a pulse width modulator may be used as another example. FIG. 7 is a block diagram illustrating another configuration example of the pulse modulator in the first exemplary embodiment. Referring to FIG. 7, first pulse modulator 12 is different from that illustrated in FIG. 4 in that first pulse modulator 12 is a pulse width modulating circuit which includes subtractor 21, comparator 23, and switching amplifier 24. A configuration of other components is the same as that illustrated in FIG. 4.

A part of the amplitude signal detected by envelope detector 15 is provided to subtractor 21. Subtractor 21 obtains the difference between the amplitude signal and a reference triangle waveform signal, and provides the difference to comparator 23.

Comparator 23 decides the magnitude relation between the amplitude signal and the triangle waveform signal by comparing the difference with a threshold. Here, it is assumed that when the amplitude signal is larger than the triangle waveform signal, an output is "+1", and when the amplitude signal is smaller than the triangle waveform signal, an output is "0". In the output pulse string of comparator 23, as a width signal is larger, as compared with the triangle waveform, an area of "+1" becomes more, and as the amplitude component is smaller, an area of "0" becomes more. As a result, the output of comparator 23 becomes a signal which is obtained by pulse-width-modulating the amplitude signal detected by envelope detector 15. The pulse-width-modulated signal outputted from comparator 23 is provided to switching amplifier 24.

Switching amplifier 24 amplifies current of the pulse-width-modulated signal to provide the signal to low-pass filter 14 by turning on/off electric power source voltage VCC with the pulse-width-modulated signal from comparator 23. When passing through low-pass filter 14, the pulse-width-modulated signal becomes a signal which is obtained by amplifying the original analog amplitude signal.

The remaining switching noise corresponding to a cycle of the reference triangle waveform signal is included in the pulse-width-modulated signal of first pulse modulator 12. Therefore, an error attributed to the remaining switching noise is corrected by error corrector 13. A configuration of error corrector 13 is the same as that illustrated in FIGS. 4, 5 and 6.

According to this example, in first pulse modulator 12, a signal is switching-amplified in a highly efficient pulse width modulation, and subsequently, in error corrector 13, the minute remaining error is eliminated by using a linear amplifier whose electric power consumption is small, so that the signal can be amplified highly efficiently and in high quality.

Figure 8:
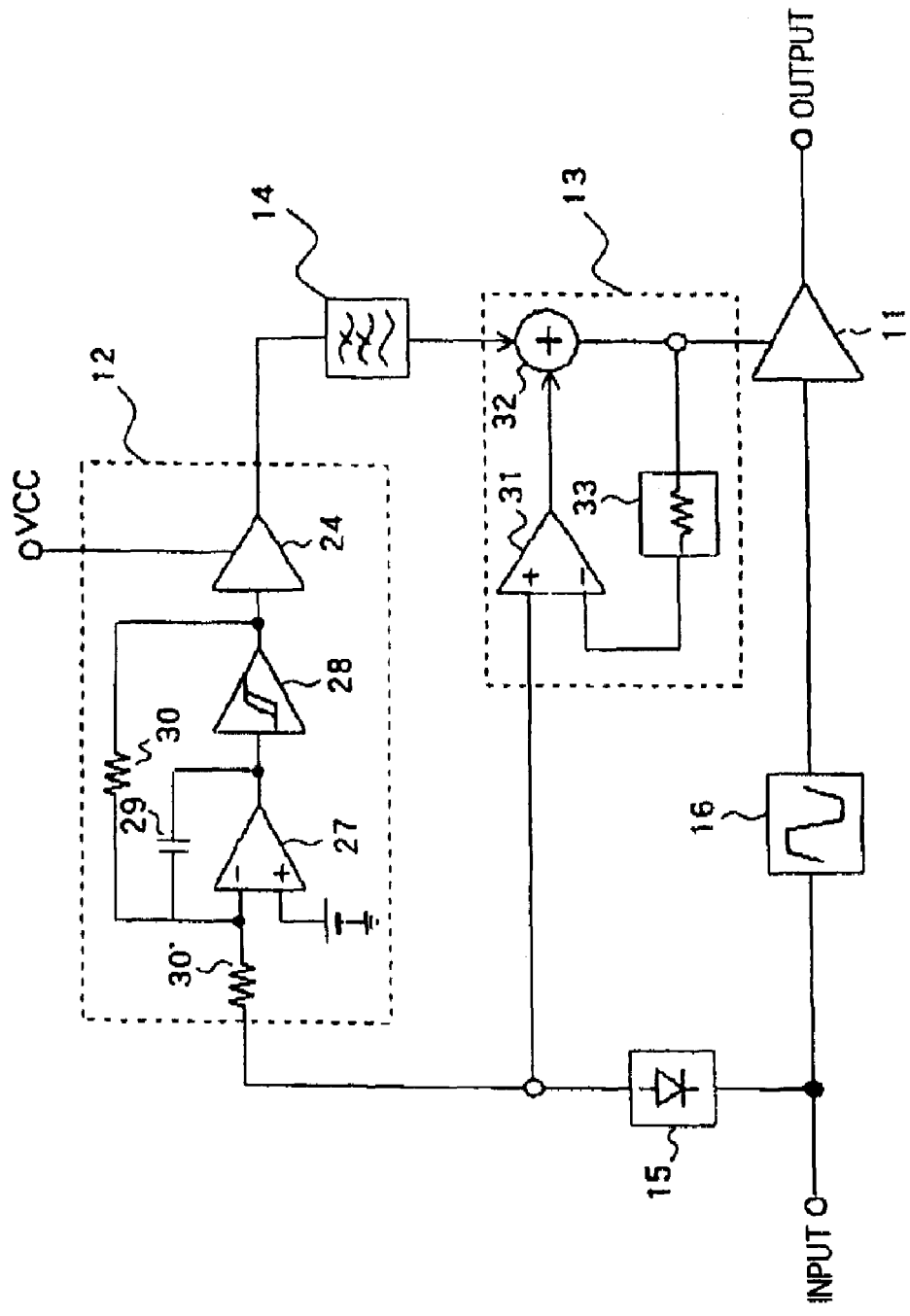
FIG. 8 is a block diagram illustrating yet another configuration example of a first pulse modulator in the first exemplary embodiment.

FIG. 8 is a block diagram illustrating yet another configuration example of the pulse modulator in the first exemplary embodiment. Referring to FIG. 8, first pulse modulator 12 is different from that illustrated in FIG. 4 in that first pulse modulator 12 is a pulse width modulating circuit including operational amplifier 27, Schmitt circuit 28, switching amplifier 24, capacitance 29, and resistors 30 and 30'. A configuration of other parts is the same as that illustrated in FIG. 4.

An inversion-integrator is configured with operational amplifier 27, capacitance 29, and registor 30. Schmitt circuit 28 is a hysteresis comparator including two thresholds of a low voltage side and a high voltage side.

An output of Schmitt circuit 28 is fed back to the input of operational amplifier 27 through registor 30, so that if the output level of Schmitt circuit 28 rises, the output of operational amplifier 27 is inversion-integrated, and the level is lowered. If the output level of operational amplifier 27 is lowered, and reaches a low voltage side threshold of Schmitt circuit 28, the output of Schmitt circuit 28 transfers from a high level to a low level. As a result, a polarity of the input of an inversion-integrator is changed, so that the output level of operational amplifier 27 starts rising. If the output level of operational amplifier 27 rises, and reaches a high voltage side threshold of Schmitt circuit 28, the output of Schmitt circuit 28 transfers from the low level side to the high level side. If the amplitude signal is not inputted, the inversion-integrator independently continues to generate a pulse string, whose cycle is constant, by repeating this operation.

Referring to FIG. 8, a part of the amplitude signal detected by envelope detector 15 is provided through registor 30' to operational amplifier 27. If the amplitude signal is inputted, an offset is provided to the input of operational amplifier 27 and the input level rises, so that the pulse width becomes wider. Therefore, first pulse modulator 12 operates as a pulse width modulator as a whole. Particularly in this configuration, it is not necessary to provide the reference triangle waveform signal from the outside like the example illustrated in FIG. 7, and a pulse-width-modulated signal is independently induced. Thus, the entire configuration of the example of FIG. 8 can be more simplified than that of FIG. 7.

The pulse-width-modulated signal which is generated by the inversion-integrator, and is outputted from Schmitt circuit 28 is provided to switching amplifier 24. Switching amplifier 24 amplifies current of the pulse-width-modulated signal by turning on/off electric power source voltage VCC with the pulse-width-modulated signal. The output of switching amplifier 24 passes through low-pass filter 14, and thereby, a signal is regenerated, which is obtained by amplifying the original analog amplitude signal.

The regenerated signal includes the remaining switching noise corresponding to a self-oscillating frequency. Error corrector 13 corrects the error attributed to the remaining switching noise. A configuration and the operation of error corrector 13 is the same as those illustrated in FIGS. 4, 5 and 6.

In the first exemplary embodiment illustrated in FIGS. 3 to 7, an example is illustrated in which the present invention is applied to the EER amplifier which includes limiter 16 extracting a phase component of an input signal, however, the present invention can be also applied to the ET amplifier in which limiter 16 is omitted from the EER configuration illustrated in FIGS. 3 to 7.

Second Exemplary Embodiment

In high frequency amplifying apparatus 10 of the first exemplary embodiment illustrated in FIG. 3, error corrector 13 uses the amplitude signal which is not mixed with the phase signal from limiter 16 and which is provided from low-pass filter 14 to correct an error. However, the present invention is not limited to this configuration. As another configuration example, error corrector 13 may extract the amplitude component from a high frequency output signal which is obtained by mixing the amplitude signal from low-pass filter 14 and the phase signal from limiter 16 in RF amplifier 11, and may use the amplitude component to correct the error.

Figure 9:
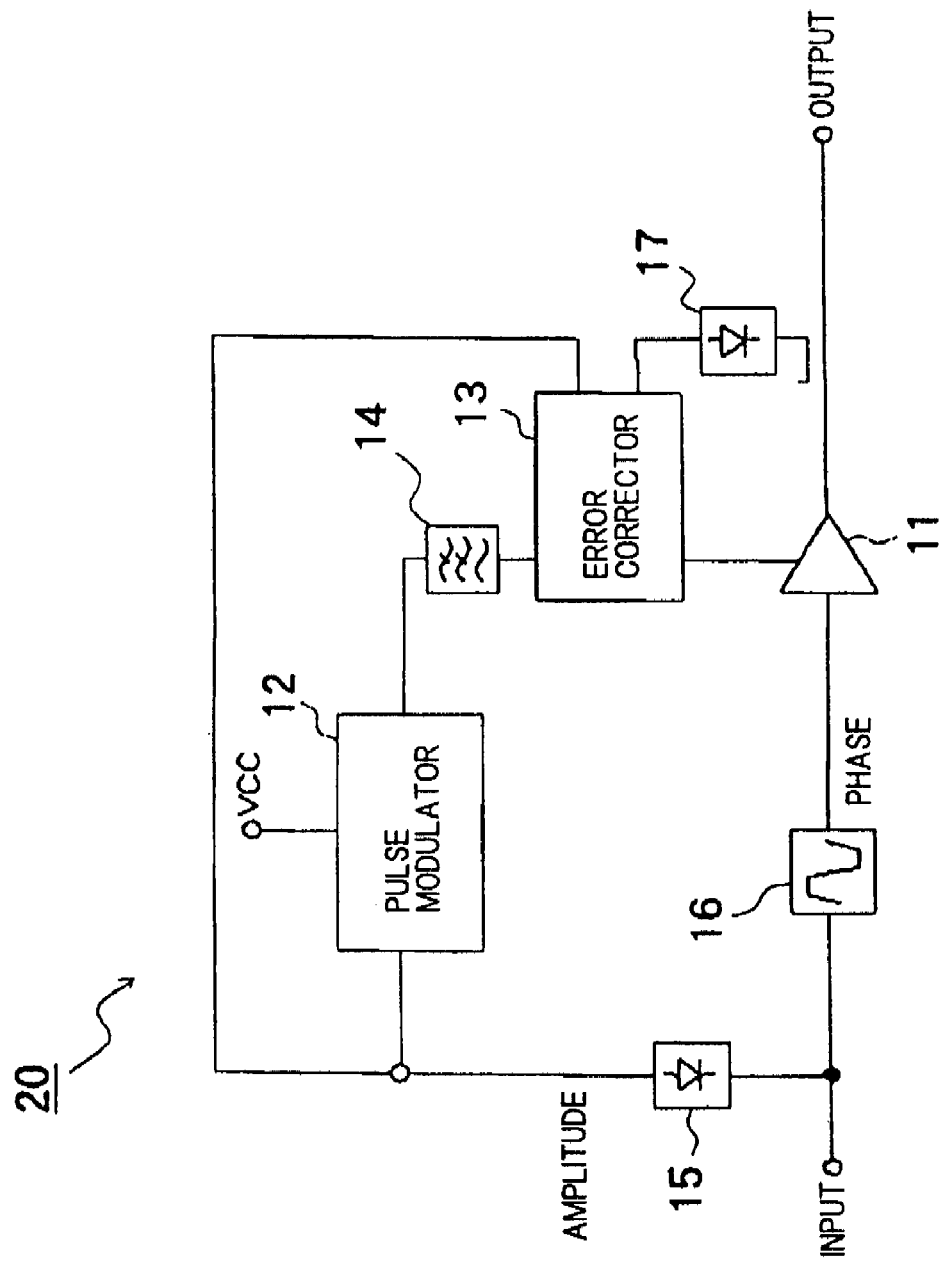
FIG. 9 is a block diagram illustrating a configuration of a high frequency amplifying apparatus according to a second exemplary embodiment.

FIG. 9 is a block diagram illustrating a configuration of a high frequency amplifying apparatus according to a second exemplary embodiment. Referring to FIG. 9, high frequency amplifying apparatus 20 includes RF amplifier 11, first pulse modulator 12, error corrector 13, low-pass filter 14, envelope detector 15, limiter 16, and envelope detector 17.

High frequency amplifying apparatus 20 according to the second exemplary embodiment includes envelope detector 17 which is not included in the first exemplary embodiment illustrated in FIG. 3. In the second exemplary embodiment, envelope detector 17 extracts the amplitude component from the high frequency output signal generated by RF amplifier 11, and error corrector 13 compares the signal of the amplitude component extracted by envelope detector 17 with the amplitude signal from envelope detector 15 to correct an error by using the comparison result.

Figure 10:
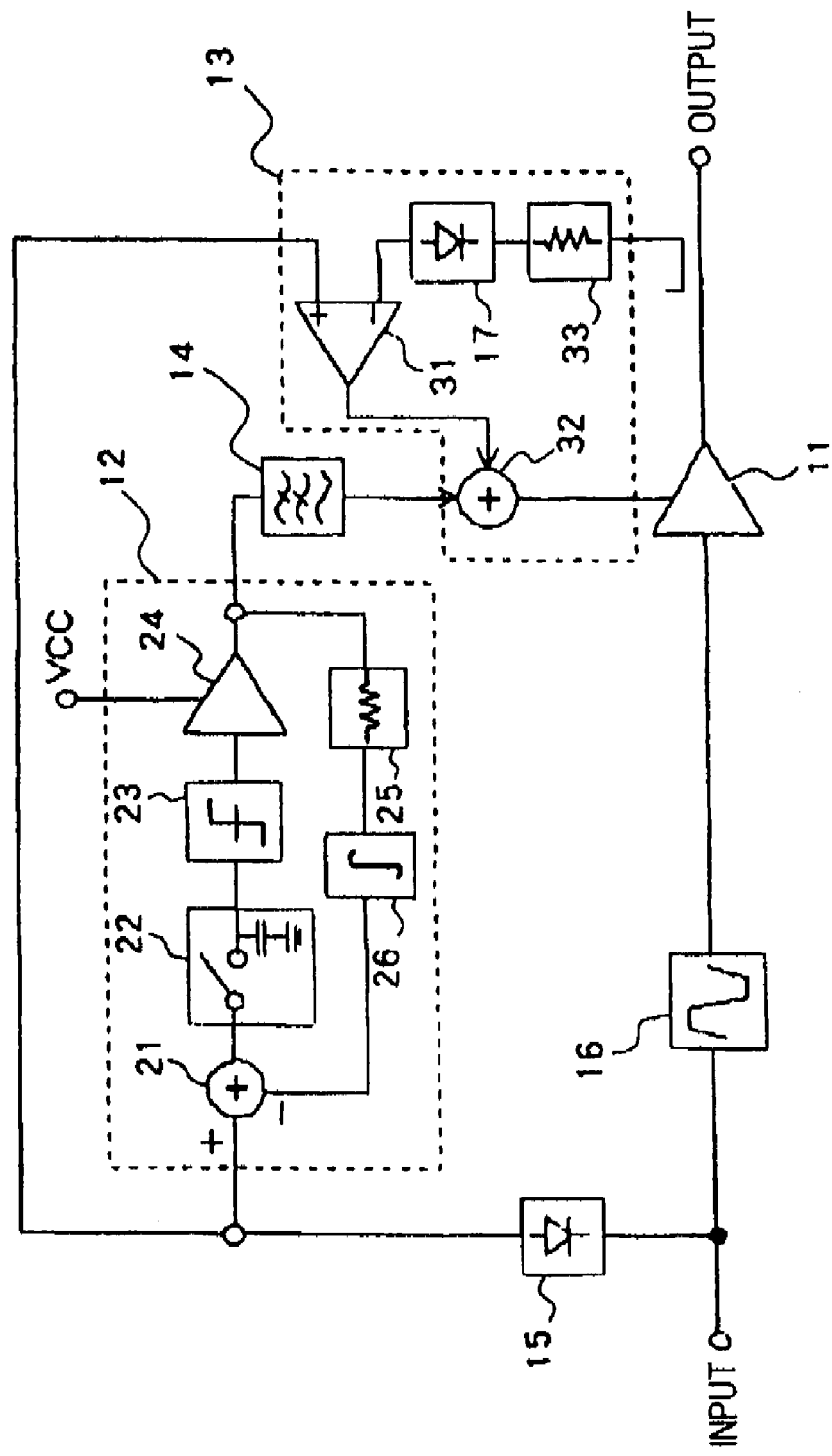
FIG. 10 is a block diagram illustrating a detailed configuration of the high frequency amplifying apparatus according to the second exemplary embodiment.

FIG. 10 is a block diagram illustrating a detailed configuration of the high frequency amplifying apparatus according to the second exemplary embodiment. Referring to FIG. 10, first pulse modulator 12 illustrated in FIG. 9 includes subtractor 21, sample hold circuit 22, comparator (quantizer) 23, switching amplifier 24, attenuator 25, and integrator 26. This configuration is the same as that illustrated in FIG. 3.

Error corrector 13 of FIG. 10 includes envelope detector 17, error amplifier 31, adder 32, and attenuator 33. Meanwhile, in FIG. 9, envelope detector 17 exists outside error corrector 13, and in FIG. 10, envelope detector 17 exists outside error corrector 13, however, both configurations may be available.

A high frequency output signal from RF amplifier 11 is caused to branch to an output terminal and attenuator 33, and the signal, which is attenuated by attenuator 33 to an appropriate level, is provided to envelope detector 17. Envelope detector 17 extracts the amplitude component of the output signal from RF amplifier 11 to provide the amplitude component to error amplifier 31.

A configuration of other components of error corrector 13 illustrated in FIG. 10 is the same as that illustrated in FIG. 3. Error amplifier 31 compares a signal from envelope detector 15 with a signal from envelope detector 17 to obtain the difference, and provides the difference to adder 32 as a correction signal. Adder 32 adds a signal from low-pass filter 14 and a correction signal from error amplifier 31 to provide the resultant signal to RF amplifier 11 as an electric power source.

According to the present exemplary embodiment, the error attributed to the quantization noise induced in first pulse modulator 12 and also the waveform distortion induced in RF amplifier 11 can be corrected by error corrector 13 which is separately configured from first pulse modulator 12, and whose electric power consumption is small. Therefore, according to the present exemplary embodiment, the error induced in first pulse modulator 12 and RF amplifier 11 can be corrected without increasing the sampling frequency in first pulse modulator 12, so that a high frequency signal can be amplified highly efficiently (low electric power consumption) and with high quality (low SNR).

Meanwhile, in FIGS. 9 and 10, the amplitude signal is extracted from the output signal of RF amplifier 11 by using a directional coupler, however, the present invention is not limited to this configuration. Attenuator 33 may be directly connected to a RF signal path by causing the impedance of attenuator 33 to be sufficiently high.

Instead of error corrector 13 of FIG. 10, a configuration may be adopted which includes second pulse modulator as illustrated in FIG. 5.

Instead of error corrector 13 of FIG. 10, a configuration may be adopted, which includes a plurality of feedback loops as illustrated in FIG. 6.

Instead of first pulse modulator 12 of FIG. 10, a sigma delta modulator may be used, whose degree is arbitrary. Alternatively, instead of first pulse modulator 12 of FIG. 10, the pulse width modulator as illustrated in FIG. 7 or FIG. 8 may be used.

Also in the second exemplary embodiment, the present invention can be applied to the ET amplifier in which limiter 16 is eliminated from the EER configuration illustrated in FIG. 9 and FIG. 10.

Third Exemplary Embodiment

In the first exemplary embodiment, a configuration is described in which the amplitude component is extracted by envelope detector 15, and the phase component is extracted by limiter 16 from the high frequency input signal, however, the present invention is not limited to this configuration. If a base band section is configured to be able to output the amplitude signal and the phase signal, the high frequency amplifying apparatus may directly use those signals. If so, extraction of the amplitude signal by envelope detector 15 and extraction of the phase signal from the high frequency input signal, become unnecessary, so that the size of circuit is reduced.

Figure 11:
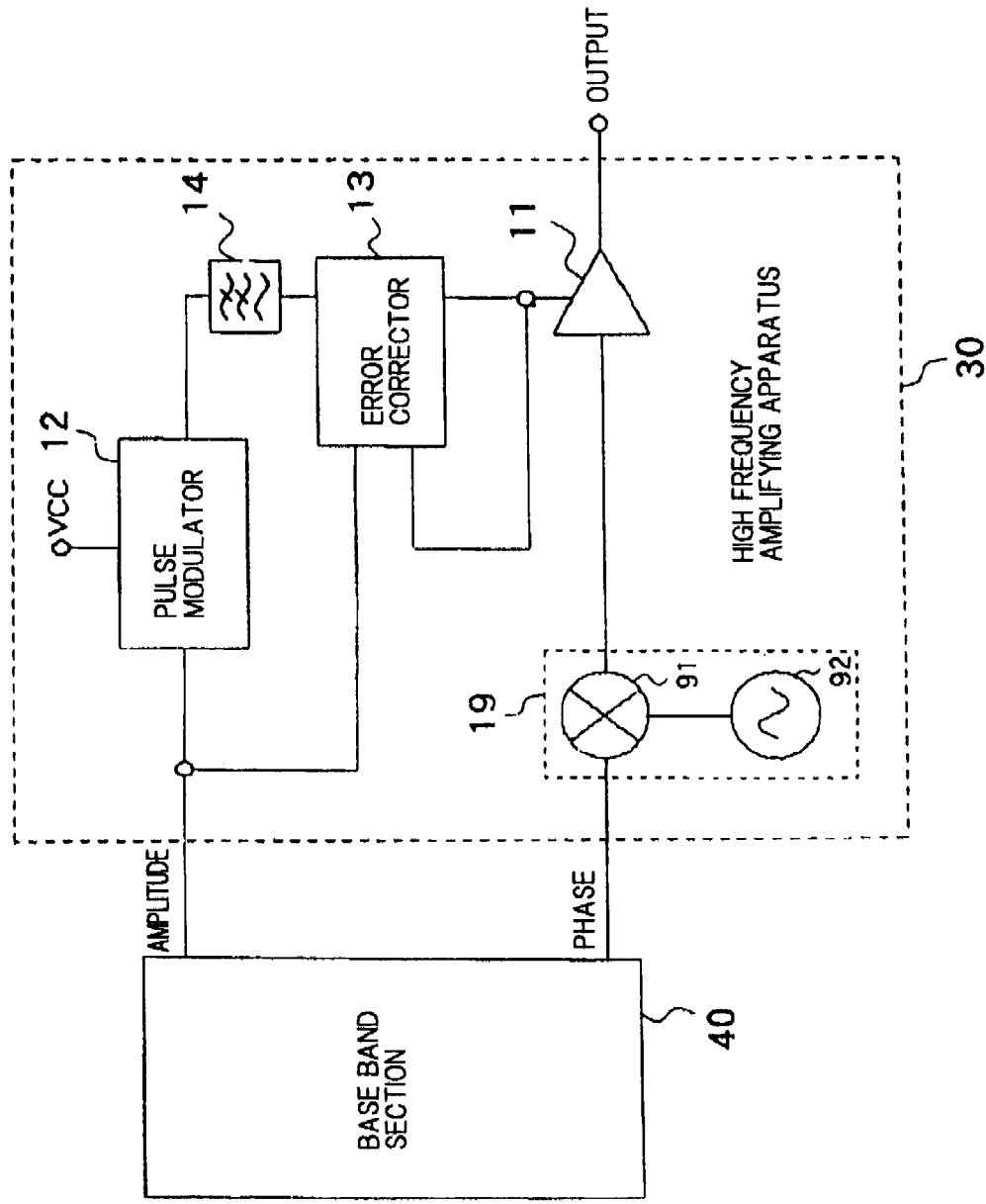
FIG. 11 is a block diagram illustrating a configuration of a high frequency amplifying apparatus according to a third exemplary embodiment.

FIG. 11 is a block diagram illustrating a configuration of a high frequency amplifying apparatus according to a third exemplary embodiment. Referring to FIG. 11, high frequency amplifying apparatus 30 includes RF amplifier 11, first pulse modulator 12, error corrector 13, low-pass filter 14, and frequency converter 19. An amplitude signal and a phase signal are inputted from base band section 40 incorporated in the same wireless apparatus (not illustrated) to high frequency amplifying apparatus 30.

Whereas in first exemplary embodiment illustrated in FIG. 3, the phase signal from limiter 16 is provided to first pulse modulator 12 and error corrector 13, in the present exemplary embodiment, the amplitude signal from base band section 40 is provided to first pulse modulator 12 and error corrector 13.

Whereas in first exemplary embodiment illustrated in FIG. 3, the amplitude signal from envelope detector 15 is provided to RF amplifier 11, in the present exemplary embodiment, the phase signal from base band section 40 is converted by frequency converter 19 to a phase signal of a carrier frequency to be provided to RF amplifier 11. The carrier frequency typically belongs to a gigahertz band. Frequency converter 19 includes local signal generator 92 and mixer 91. Local signal generator 92 generates an oscillating signal of the carrier frequency, and mixer 91 mixes the oscillating signal and the phase signal from base band section 40 to generate the phase signal of the carrier frequency.

First pulse modulator 12 of the present exemplary embodiment may be the delta modulator illustrated in FIG. 4 or the pulse width modulator illustrated in FIGS. 7 and 8. Error corrector 13 may include a plurality of feedback loops as illustrated in FIG. 6. Alternatively, error corrector 13 may be configured to use a reference signal obtained through the envelope detector from the high frequency output signal of RF amplifier 11 as illustrated in FIG. 9.

First pulse modulator 12 of the present exemplary embodiment may be the delta modulator illustrated in FIG. 4, and the pulse width modulator illustrated in FIGS. 7 and 8. Error corrector 13 may include the second pulse modulator as illustrated in FIG. 5, or a plurality of feedback loops as illustrated in FIG. 6. Alternatively, error corrector 13 may be configured to use a reference signal obtained through an envelope detector from a high frequency output signal of RF amplifier 11 as illustrated in FIG. 9.

Figure 12:
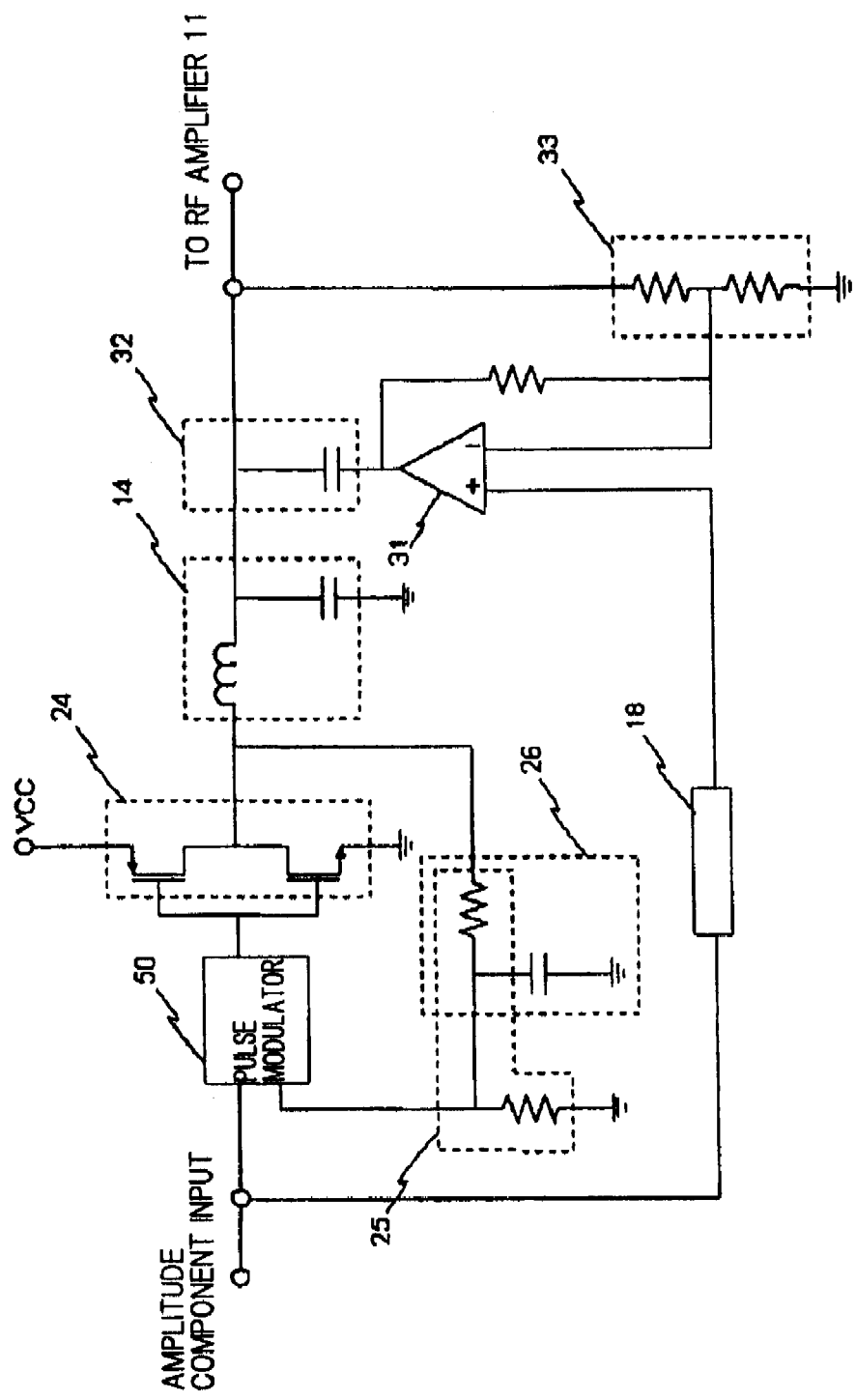
FIG. 12 is a block diagram illustrating a specific configuration example around a first pulse modulator and an error corrector in the high frequency amplifying apparatus according to the third exemplary embodiment.
Figure 13:
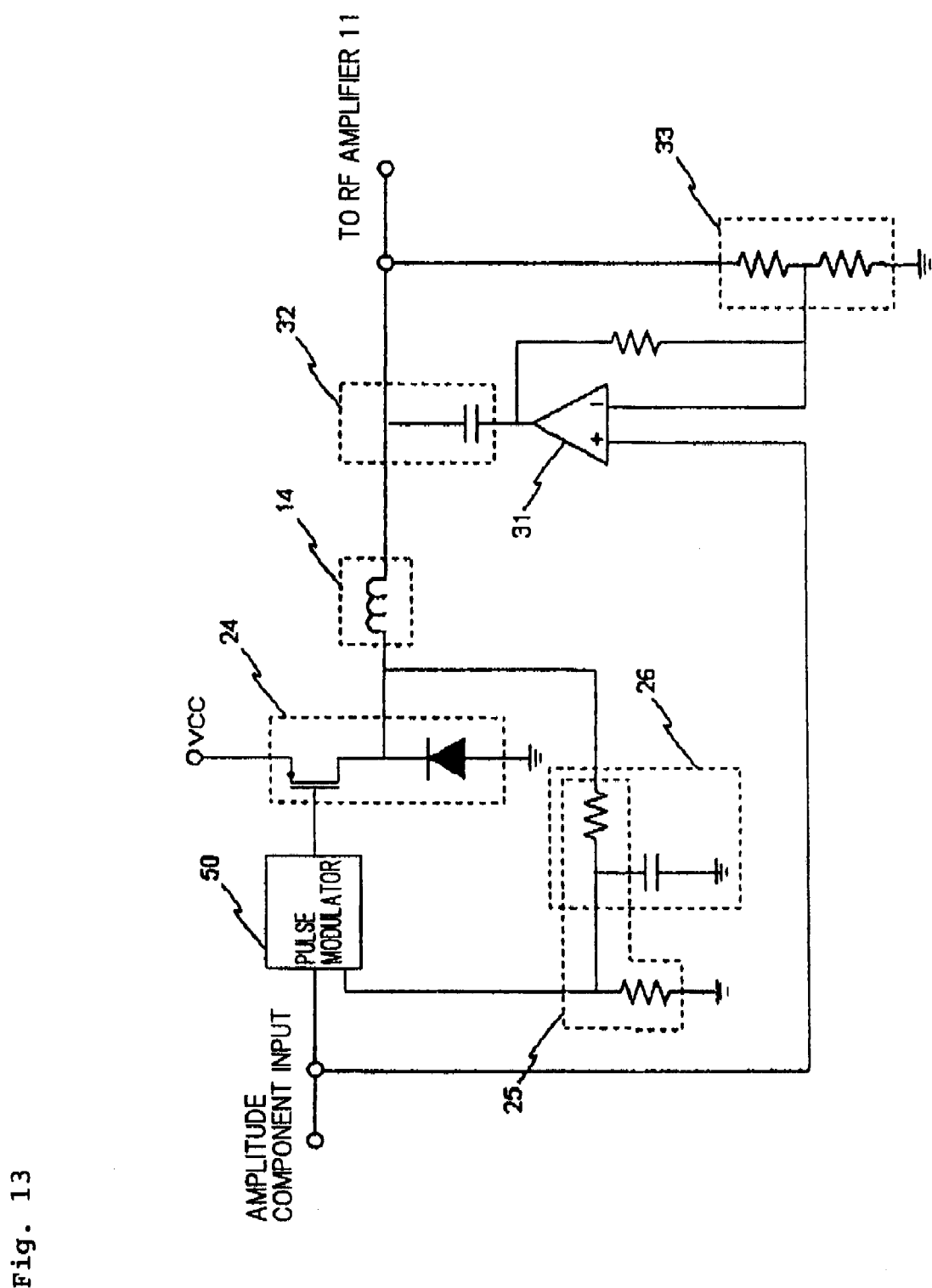
FIG. 13 is a block diagram illustrating another specific configuration example around a first pulse modulator and an error corrector in the high frequency amplifying apparatus according to the third exemplary embodiment.

FIGS. 12 and 13 are block diagrams illustrating specific configuration examples around the pulse modulator and the error corrector in the high frequency amplifying apparatus according to the third exemplary embodiment.

As a common part in FIGS. 12 and 13, the part corresponding to first pulse modulator 12 of FIG. 11 is configured with pulse modulator 50, switching amplifier 24, attenuator 25, and integrator 26. Pulse modulator 50 is configured with subtractor 21, sample hold circuit 22, and comparator 23 which are illustrated in FIG. 4.

Integrator 26 in FIGS. 12 and 13 is a primary RC low-pass filter. Attenuator 25 is configured with two resistors, and one of the two resistors is also a register of integrator 26. Low-pass filter 14 is configured with a lossless and second-order LC low-pass filter.

Furthermore, as a common part in FIGS. 12 and 13, a part corresponding to error corrector 13 of FIG. 11 is configured with error amplifier 31, adder 32, and attenuator 33. Attenuator 33 is configured with two resistors. Adder 32 is configured with a capacitance.

As a part in which FIG. 12 and FIG. 13 are different from each other, in an example of FIG. 12, switching amplifier 24 is an inverter configured with a PMOS transistor and a NMOS transistor. On the other hand, in the example of FIG. 13, switching amplifier 24 is configured with the PMOS transistor and a diode.

In the example of FIG. 12, low-pass filter 14 is configured with the lossless and second-order LC low-pass filter. In this case, if delay line 18 is provided in one input of error amplifier 31 to correct a phase shifting induced in the second-order LC low-pass filter, the advantageous effect of the error correction is further increased. On the other hand, in the example of FIG. 13, low-pass filter 14 is configured with a lossless and primary L filter. In this case, the phase shifting is not induced in low-pass filter 14, so that a delay line is unnecessary. Meanwhile, it is apparent that reverse combination of the number of degrees of filter 14 and switching amplifier 24 is available. While adder 32 is configured with a capacitance in examples of FIG. 12 and FIG. 13, a transformer may be used. Furthermore, a parallel capacitance or a series capacitance may be appropriately added to a feedback loop to reduce the influence attributed to phase compensation and DC offset.

According to each of the exemplary embodiments of the present invention described above, the advantageous effects described below can be obtained.

Figure 15:
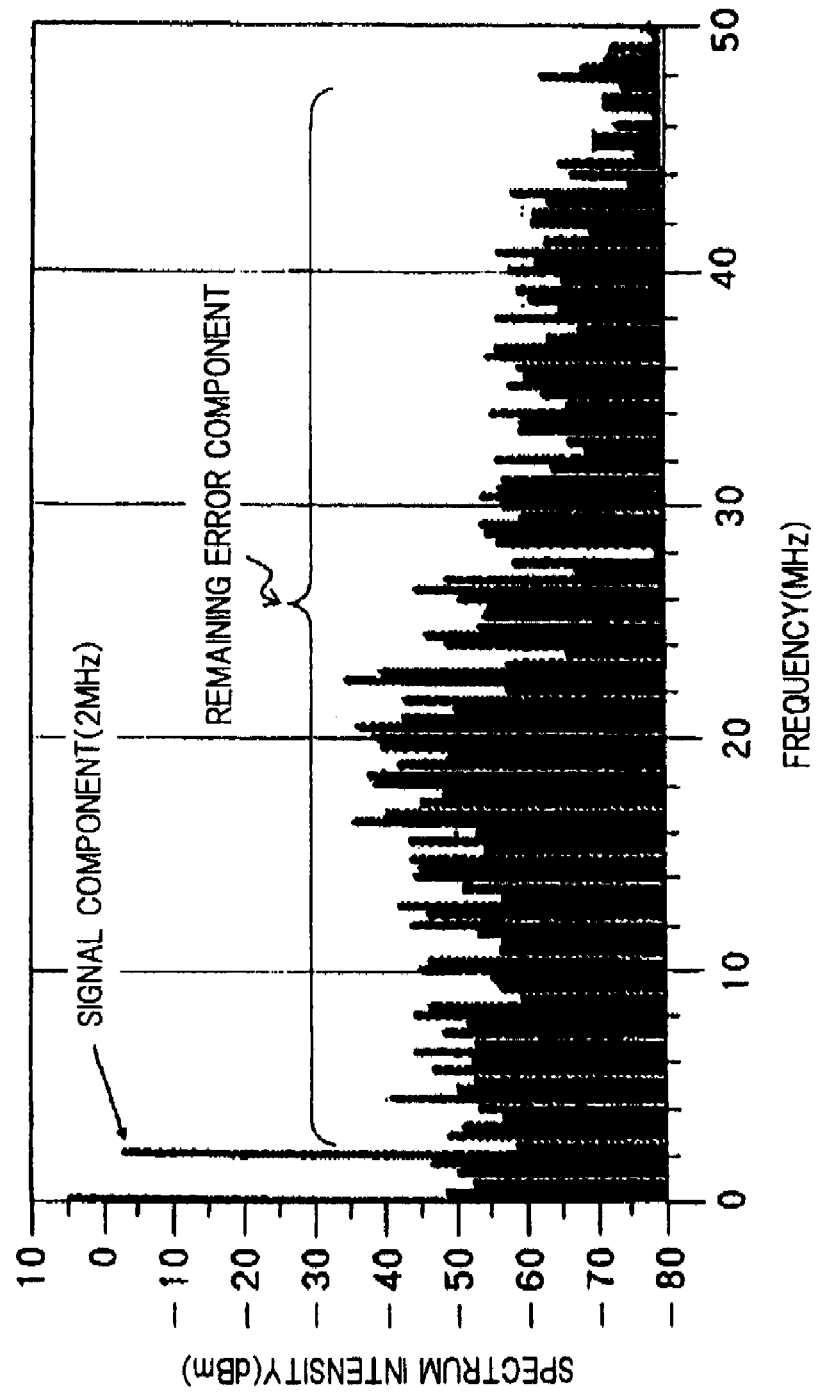
FIG. 15 is a graph illustrating a frequency spectrum of the output signal of the delta modulator.

FIG. 14 is a graph illustrating an input signal and an output signal of the delta modulator. FIG. 15 is a graph illustrating a frequency spectrum of the output signal of the delta modulator.

In FIGS. 14 and 15, the input signal is a sin wave whose frequency is 2 MHz. The output signal refers to the output of low-pass filter 14 in the present exemplary embodiment (e.g. FIG. 4).

Referring to the output signal of FIG. 14, the noise attributed to the quantization noise of comparator 23 illustrated in FIG. 4 is superimposed to the sin wave of 2 MHz. Referring to the frequency spectrum of FIG. 15, other than a signal component of 2 MHz, a large amount of the remaining error component is distributed in a frequency band from a low frequency to a high frequency, so that the SN ratio of the output signal is degraded. In the high frequency amplifying apparatus as illustrated in FIG. 1, the output signal is not corrected and is used as an electric power source of a RF amplifier.

Figure 16:
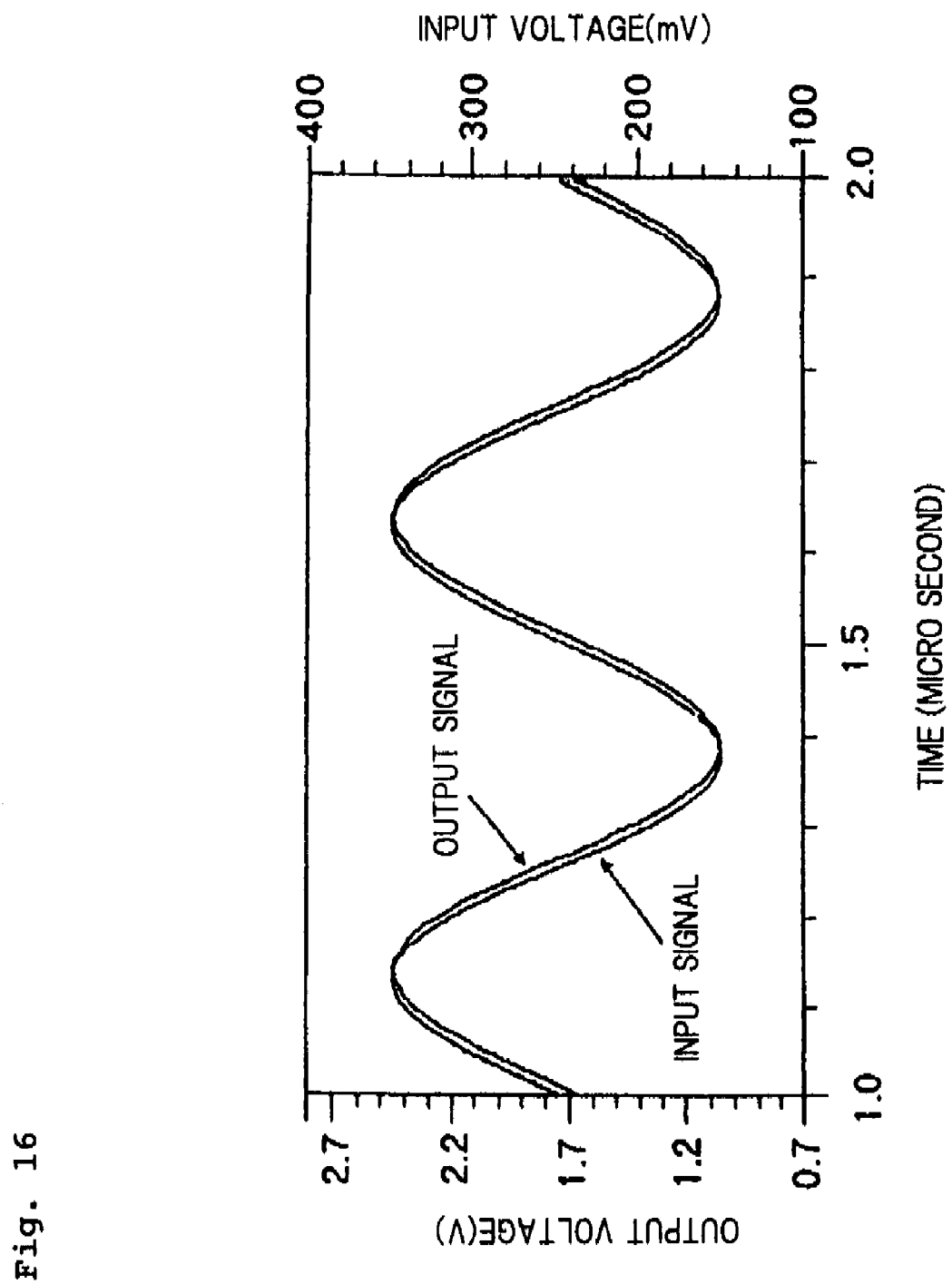
FIG. 16 is a graph illustrating the input signal of the delta modulator, and the output signal which is obtained by correcting an error of the output of the delta modulator.
Figure 17:
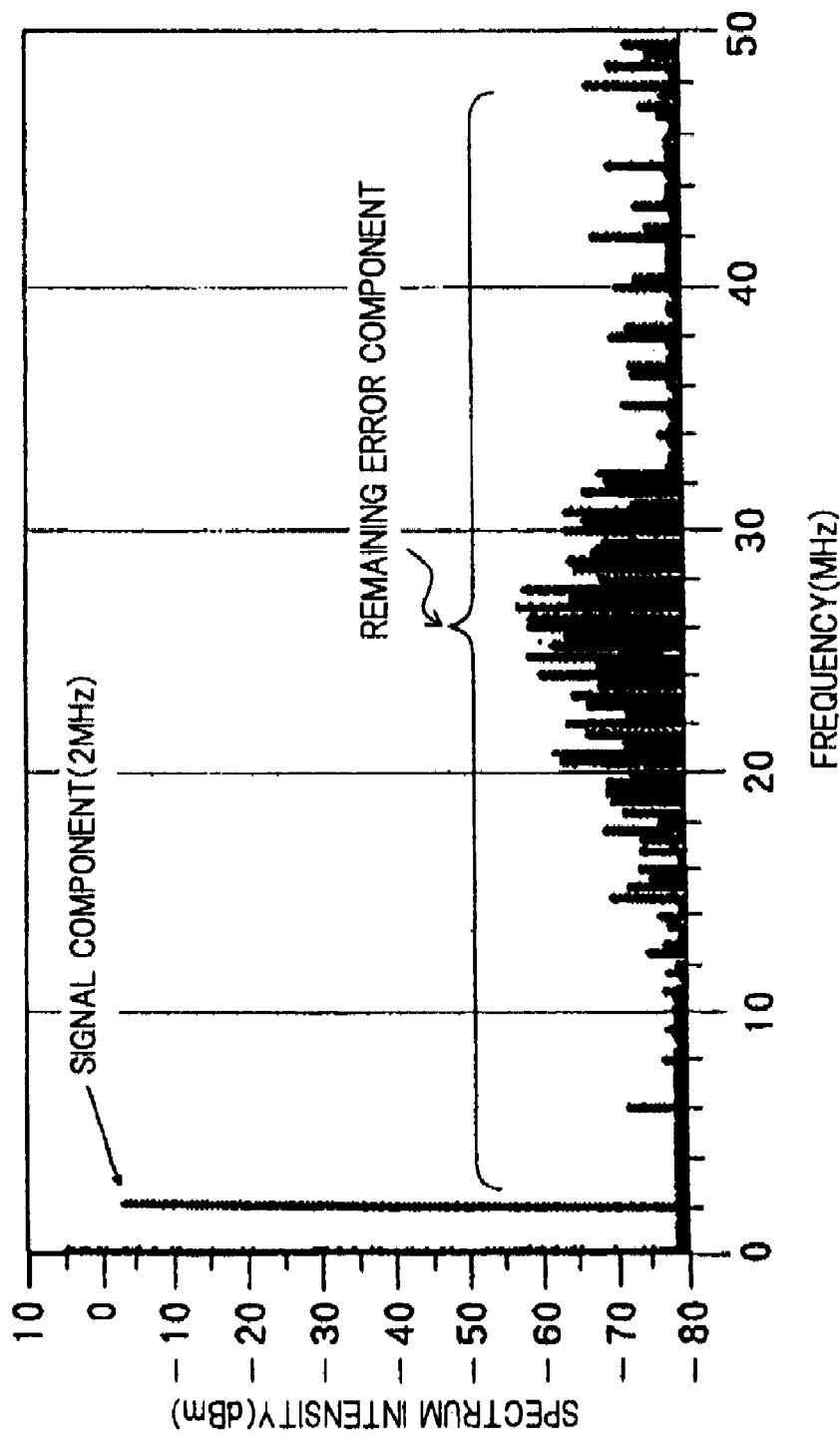
FIG. 17 is a graph illustrating a frequency spectrum of the output signal which is obtained by correcting the error of the output of the delta modulator.

FIG. 16 is a graph illustrating the input signal of the delta modulator, and an output signal which is obtained by correcting an error of the output of the delta modulator. FIG. 17 is a graph illustrating a frequency spectrum of the output signal which is obtained by correcting the error of the output of the delta modulator.

Referring to the output signal of FIG. 16, it can be understood that noise and distortion are reduced as compared with the output signal of FIG. 14. Referring to the frequency spectrum of FIG. 17, the remaining error is still left, but is considerably reduced as compared with FIG. 15, and the SN ratio of the output signal is considerably improved.

Error corrector 13 correcting the error only needs to be able to amplify an error attributed to the quantization noise, which is indicated as the difference between the input signal and the output signal in FIG. 14, so that the error can be corrected with small electric power consumption, and an amplified amplitude signal of high quality can be obtained.

Meanwhile, even when the amplitude and frequency of the input signal are changed, an optimal pulse-modulated signal is independently generated according to the principle of the delta modulating method, so that these advantageous effects are maintained.

In each of the exemplary embodiments of the present invention, even if a waveform of the amplitude component of the input signal is changed, the high frequency amplifying apparatus independently adapts to generate the pulse-modulated signal, and constantly delivers appropriate DC current to the RF amplifier. Therefore, according to each of the exemplary embodiments of the present invention, the high frequency input signal which has the high PAPR can be constantly amplified highly efficiently and with a high quality across a wide dynamic range. Furthermore, the high frequency input signal can be also constantly amplified highly efficiently and in high quality, which is processed by plural kinds of different communication methods.

For example, in a related method in which a plurality of levels of electric power source voltages VCC are provided, and in which the electric power source voltages are changed step by step according to an input amplitude level, even if optimization can be realized for a prescribed input level or for a prescribed amplitude waveform, optimal DC electric current may not be delivered to the RF amplifier when the input level or the amplitude waveform is changed. On the other hand, according to the exemplary embodiments of the present invention, the high frequency input signal can be constantly amplified highly efficiently and with high quality.

While preferred embodiments of the present invention have been described using specific terms, such description is for illustrative purposes only, and it is to be understood that changes and variations may be made without departing from the spirit or scope of the following claims.

What is claimed is:

1. An amplifying apparatus generating an output signal obtained by amplifying an input signal by amplifying an amplitude component of the input signal including the amplitude component and a phase component, and mixing the amplified amplitude component and the phase component, comprising:
    a pulse modulator generating a pulse-modulated signal by pulse-modulating and amplifying the amplitude component of the input signal;
    a low-pass filter filtering the pulse-modulated signal from the pulse modulator, and generating an amplified amplitude signal obtained by amplifying the amplitude component;
    an error corrector generating a corrected amplitude signal by correcting an error included in the amplified amplitude signal from the low-pass filter by using the amplitude component of the input signal; and a mixing unit generating the output signal by mixing the corrected amplitude signal from the error corrector and the phase component of the input signal, wherein the error corrector detects a difference between the amplitude component and the amplified amplitude signal by using a linear amplifier, generates a pulse signal by pulse-modulating and amplifying a signal of the difference in a second pulse modulator, filters the pulse signal, and subsequently, negatively feeds back the pulse signal to the linear amplifier.

2. The amplifying apparatus according to claim 1,
wherein the error corrector compares the corrected amplitude signal generated by itself with the amplitude component of the input signal, and corrects the amplified amplitude signal from the low-pass filter based on the result of the comparison.

3. The amplifying apparatus according to claim 1,
wherein the error corrector extracts an amplitude component of the output signal and compares the extracted amplitude component with the amplitude component of the input signal, and corrects the amplified amplitude signal from the low-pass filter based on a result of the comparison.

4. The amplifying apparatus according to claim 1, further comprising: an envelope detector extracting the amplitude component from the input signal.

5. The amplifying apparatus according to claim 4, further comprising: a limiter extracting the phase component from the input signal.

6. The amplifying apparatus according to claim 4,
wherein the amplifying apparatus uses the input signal including the amplitude component and the phase component.

7. The amplifying apparatus according to claim 1,
wherein the amplitude component and the phase component of the input signal are input to the amplifying apparatus from a base band section.

8. The amplifying apparatus according to claim 7,
wherein the amplifying apparatus mixes a carrier frequency with the phase component from the base band section and uses the phase component.

9. The amplifying apparatus according to claim 1,
wherein the error corrector amplifies the difference between the amplitude component and the amplified amplitude component by using a linear amplifier, and negatively feed back the difference.

10. The amplifying apparatus according to claim 1,
wherein the mixing unit generates the output signal by amplifying the phase component with an amplifier operating by using the corrected amplitude signal from the error corrector as an electric power source.

11. The amplifying apparatus according to claim 1,
wherein the pulse modulator amplifies a current by using a switching amplifier at an output stage of the pulse modulator.

12. The amplifying apparatus according to claim 1,
wherein the pulse modulator pulse-modulates the amplitude component of the input signal with a delta modulating method.

13. The amplifying apparatus according to claim 1,
wherein the pulse modulator pulse-modulates the amplitude component of the input signal using a sigma delta modulating method.

14. The amplifying apparatus according to claim 1,
wherein the pulse modulator pulse-modulates the amplitude component of the input signal using a pulse width modulation method.

15. The amplifying apparatus according to claim 1,
wherein the second pulse modulator pulse-modulates the signal of the difference from the linear amplifier in a delta modulation method.

16. The amplifying apparatus according to claim 1,
wherein the second pulse modulator pulse-modulates the signal of the difference from the linear amplifier in a sigma delta modulation method.

17. The amplifying apparatus according to claim 1,
wherein the second pulse modulator pulse-modulates the signal of the difference from the linear amplifier in a pulse width modulation method.

18. An amplifying apparatus generating an output signal obtained by amplifying an input signal by amplifying an amplitude component of the input signal including the amplitude component and a phase component, and mixing the amplified amplitude component and the phase component, comprising:

a pulse modulator generating a pulse-modulated signal by pulse-modulating and amplifying the amplitude component of the input signal;

a low-pass filter filtering the pulse-modulated signal from the pulse modulator, and generating an amplified amplitude signal obtained by amplifying the amplitude component;

an error corrector generating a corrected amplitude signal by correcting an error included in the amplified amplitude signal from the low-pass filter by using the amplitude component of the input signal; and a mixing unit generating the output signal by mixing the corrected amplitude signal from the error corrector and the phase component of the input signal, wherein the error corrector extracts an amplitude component of the output signal and compares the extracted amplitude component with the amplitude component of the input signal, and corrects the amplified amplitude signal from the low-pass filter based on a result of the comparison.

19. An amplifying apparatus generating an output signal obtained by amplifying an input signal by amplifying an amplitude component of the input signal including the amplitude component and a phase component, and mixing the amplified amplitude component and the phase component, comprising:

a pulse modulator generating a pulse-modulated signal by pulse-modulating and amplifying the amplitude component of the input signal;

a low-pass filter filtering the pulse-modulated signal from the pulse modulator, and generating an amplified amplitude signal obtained by amplifying the amplitude component;

an error corrector generating a corrected amplitude signal by correcting an error included in the amplified amplitude signal from the low-pass filter by using the amplitude component of the input signal; and a mixing unit generating the output signal by mixing the corrected amplitude signal from the error corrector and the phase component of the input signal, wherein the error corrector compares the corrected amplitude signal generated by itself with the amplitude component of the input signal, and corrects the amplified amplitude signal from the low-pass filter based on the result of the comparison.

\* \* \* \* \*